US010527856B2

(12) United States Patent
Dykaar

(10) Patent No.: US 10,527,856 B2
(45) Date of Patent: Jan. 7, 2020

(54) FREE SPACE MULTIPLE LASER DIODE MODULE WITH FAST AXIS COLLIMATOR

(71) Applicant: NORTH INC., Kitchener (CA)

(72) Inventor: Douglas R. Dykaar, Waterloo (CA)

(73) Assignee: North Inc., Kitchener, ON (CA)

( * ) Notice: Subject to any disclaimer, the term of this patent is extended or adjusted under 35 U.S.C. 154(b) by 0 days.

(21) Appl. No.: 16/171,228

(22) Filed: Oct. 25, 2018

(65) Prior Publication Data

US 2019/0121141 A1 Apr. 25, 2019

Related U.S. Application Data

(60) Provisional application No. 62/591,550, filed on Nov. 28, 2017, provisional application No. 62/597,294, (Continued)

(51) Int. Cl.
*G02B 27/01* (2006.01)
*H04N 9/31* (2006.01)
(Continued)

(52) U.S. Cl.
CPC ....... *G02B 27/0172* (2013.01); *G02B 26/101* (2013.01); *H01S 5/02208* (2013.01);
(Continued)

(58) Field of Classification Search
CPC .............. G02B 27/0172; G02B 26/101; G02B 2027/0174; G02B 2027/0178; G02B 27/0905; G02B 27/0944; G02B 27/30; H04N 9/3161; H04N 9/3135; H04N 9/3129; H01S 5/042; H01S 5/02208; (Continued)

(56) References Cited

U.S. PATENT DOCUMENTS

2006/0138239 A1  6/2006 Sonoda et al.
2011/0063871 A1  3/2011 Tanaka et al.
(Continued)

FOREIGN PATENT DOCUMENTS

CN    204496106 U   7/2015

OTHER PUBLICATIONS

International Search Report and Written Opinion of the International Searching Authority, PCT/CA2018/051344, dated Feb. 19, 2019.

*Primary Examiner* — Kyoung Lee
(74) *Attorney, Agent, or Firm* — Thomas Mahon

(57) ABSTRACT

Systems, devices, and methods for optical engines and laser projectors that are well-suited for use in wearable heads-up displays (WHUDs) are described. Generally, the optical engines of the present disclosure integrate a plurality of laser diodes (e.g., 3 laser diodes, 4 laser diodes) within a single, hermetically or partially hermetically sealed, encapsulated package. The optical engines include an optical director element that includes a curved reflective surface (e.g., parabolic cylinder) that redirects laser light beams and collimates the same along the fast axes thereof. Such optical engines may have various advantages over existing designs including, for example, smaller volumes, better manufacturability, faster modulation speed, etc. WHUDs that employ such optical engines and laser projectors are also described.

10 Claims, 12 Drawing Sheets

Related U.S. Application Data filed on Dec. 11, 2017, provisional application No. 62/608,749, filed on Dec. 21, 2017, provisional application No. 62/609,870, filed on Dec. 22, 2017, provisional application No. 62/591,030, filed on Nov. 27, 2017, provisional application No. 62/620,600, filed on Jan. 23, 2018, provisional application No. 62/576,962, filed on Oct. 25, 2017.

(51) Int. Cl.
| | | |
|---|---|---|
| *H01S 5/042* | (2006.01) | |
| *H01S 5/022* | (2006.01) | |
| *G02B 26/10* | (2006.01) | |
| *H01S 5/40* | (2006.01) | |
| *H01S 5/42* | (2006.01) | |

(52) U.S. Cl.
CPC ...... *H01S 5/02248* (2013.01); *H01S 5/02272* (2013.01); *H01S 5/02276* (2013.01); *H01S 5/02288* (2013.01); *H01S 5/02296* (2013.01); *H01S 5/042* (2013.01); *H01S 5/4075* (2013.01); *H04N 9/3161* (2013.01); *G02B 2027/0174* (2013.01); *G02B 2027/0178* (2013.01); *H01S 5/02292* (2013.01); *H01S 5/4012* (2013.01); *H01S 5/4031* (2013.01); *H01S 5/4093* (2013.01); *H01S 5/423* (2013.01); *H04N 9/3129* (2013.01); *H04N 9/3135* (2013.01)

(58) Field of Classification Search
CPC ............. H01S 5/02296; H01S 5/02288; H01S 5/02248; H01S 5/02276; H01S 5/02272; H01S 5/4075; H01S 5/4012; H01S 5/4093; H01S 5/02292; H01S 5/4031; H01S 5/423; H01S 5/02284
See application file for complete search history.

(56) References Cited

U.S. PATENT DOCUMENTS

| | | |
|---|---|---|
| 2013/0114629 A1 | 5/2013 | Firth et al. |
| 2013/0265770 A1* | 10/2013 | Breidenassel ............ F21V 7/00 362/296.01 |
| 2014/0126918 A1 | 5/2014 | Sato |
| 2014/0240952 A1 | 8/2014 | Nakanishi et al. |
| 2017/0299956 A1 | 10/2017 | Holland et al. |

* cited by examiner

FREE SPACE MULTIPLE LASER DIODE MODULE WITH FAST AXIS COLLIMATOR

BACKGROUND

Technical Field

The present disclosure is generally directed to systems, devices, and methods relating to optical engines, for example, optical engines for laser projectors used in wearable heads-up displays or other applications.

Description of the Related Art

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional scanning laser projectors, at least one controllable mirror may be used to control the spatial distribution, and may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

In a conventional laser projector comprising an RGB (red/green/blue) laser module with a red laser diode, a green laser diode, and a blue laser diode, each respective laser diode may have a corresponding respective focusing lens. Each of the laser diodes of a laser module are typically housed in a separate package (e.g., a TO-38 package or "can"). The relative positions of the laser diodes, the focusing lenses, and the at least one controllable mirror are all tuned and aligned so that each laser beam impinges on the at least one controllable mirror with substantially the same spot size and with substantially the same rate of convergence (so that all laser beams will continue to have substantially the same spot size as they propagate away from the laser projector towards, e.g., a projection screen). In a conventional laser projector, it is usually possible to come up with such a configuration for all these elements because the overall form factor of the device is not a primary design consideration. However, in applications for which the form factor of the laser projector is an important design element, it can be very challenging to find a configuration for the laser diodes, the focusing lenses, and the at least one controllable mirror that sufficiently aligns the laser beams (at least in terms of spot size, spot position, and rate of convergence) while satisfying the form factor constraints.

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. A "combiner" component of a wearable heads-up display is the physical structure where display light and environmental light merge as one within the user's field of view. The combiner of a wearable heads-up display is typically transparent to environmental light but includes some optical routing mechanism to direct display light into the user's field of view.

Examples of wearable heads-up displays include: the Google Glass®, the Optinvent Ora®, the Epson Moverio®, and the Sony Glasstron®, just to name a few.

The optical performance of a wearable heads-up display is an important factor in its design. When it comes to face-worn devices, users also care a lot about aesthetics and comfort. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal or comfort. Most wearable heads-up displays presented to date employ relatively large components and, as a result, are considerably bulkier, less comfortable and less stylish than conventional eyeglass frames.

BRIEF SUMMARY

An optical engine may be summarized as including a base substrate; a plurality of laser diodes bonded to the base substrate; at least one laser diode driver circuit, the at least one laser diode driver circuit operatively coupled to the plurality of laser diodes to selectively drive current to the plurality of laser diodes; a cap including at least one wall and at least one optical window that together define an interior volume sized and dimensioned to receive at least the plurality of laser diodes, the cap being bonded to the base substrate to provide a hermetic or partially hermetic seal between the interior volume of the cap and a volume exterior to the cap, and the optical window positioned and oriented to allow light emitted from the plurality of laser diodes to exit the interior volume; and an optical director element bonded to the base substrate proximate the plurality of laser diodes within the interior volume, the optical director element including a curved reflective surface positioned and oriented to reflect laser light from the plurality of laser diodes toward the optical window of the cap, and to collimate the laser light along the respective fast axes of the laser light from the plurality of laser diodes.

The shape of the curved reflective surface of the optical director element may be defined by a parabolic cylinder. The parabolic cylinder may include a focal line, and the plurality of diodes may be positioned along an axis that is collinear with the focal line of the parabolic cylinder. The optical director element may include an edge adjacent to the plurality of laser diodes, the edge of the optical director element may be aligned with the focal line of the parabolic cylinder in a plane that is orthogonal to a top surface of the base substrate. The optical director element may include a mirror or a prism. The plurality of laser diodes may include a red laser diode to provide a red laser light, a green laser diode to provide a green laser light, a blue laser diode to provide a blue laser light, and an infrared laser diode to provide infrared laser light. The base substrate may be formed from at least one of low temperature co-fired ceramic (LTCC), aluminum nitride (AlN), alumina, or Kovar®. The at least one laser diode driver circuit may be bonded to a first surface of the base substrate, and the plurality of laser diodes and the cap may be bonded to a second surface of the base substrate, the second surface of the base substrate opposite the first surface of the base substrate.

The at least one laser diode driver circuit, the plurality of laser diodes and the cap may be bonded to a first surface of the base substrate. The optical engine may further include a plurality of electrical connections, each electrical connection operatively coupled to the at least one laser diode driver circuit and one respective laser diode of the plurality of laser diodes, each electrical connection positioned at least partially between the cap and the base substrate; and an electrically insulating cover positioned between each electrical connection and the cap.

The plurality of laser diodes and the cap may be bonded to a first surface of the base substrate, and the laser diode driver circuit may be separate from the base substrate. The optical engine may further include: a plurality of electrical contacts bonded to the first surface of the base substrate; a plurality of electrical connections, each electrical connection operatively coupled to one respective electrical contact of the plurality of electrical contacts and one respective laser diode of the plurality of laser diodes, each electrical connection positioned at least partially between the cap and the base substrate; and an electrically insulating cover positioned between each electrical connection and the cap, wherein the at least one laser diode driver circuit is operatively coupled to the plurality of electrical contacts.

Each of the laser diodes may include one of an edge emitter laser or a vertical-cavity surface-emitting laser (VCSEL). The at least one wall of the cap may include at least one continuous sidewall having a lower first end and an upper second end, the lower first end bonded to the base substrate, and the optical window may be hermetically or partially hermetically sealed to the cap proximate the upper second end.

The optical engine may further include a plurality of chip submounts bonded to the base substrate, wherein each of the plurality of laser diodes are bonded to a corresponding one of the plurality of chip submounts to bond the laser diodes to the base substrate. The optical engine may further include a plurality of collimation lenses bonded to the optical window, each of the plurality of collimation lenses may be positioned and oriented to receive light from a corresponding one of the plurality of laser diodes through the optical window. The optical engine may further include a beam combiner positioned and oriented to combine light beams received from each of the collimation lenses into a single aggregate beam.

A wearable heads-up display (WHUD) may be summarized as including a support structure that in use is worn on the head of a user; a laser projector carried by the support structure. The laser projector may include an optical engine. The optical engine may include a base substrate; a plurality of laser diodes bonded to the base substrate; at least one laser diode driver circuit, the at least one laser diode driver circuit operatively coupled to the plurality of laser diodes to selectively drive current to the plurality of laser diodes; a cap including at least one wall and at least one optical window that together define an interior volume sized and dimensioned to receive at least the plurality of laser diodes, the cap being bonded to the base substrate to provide a hermetic or partially hermetic seal between the interior volume of the cap and a volume exterior to the cap, and the optical window positioned and oriented to allow light emitted from the plurality of laser diodes to exit the interior volume; and an optical director element bonded to the base substrate proximate the plurality of laser diodes within the interior volume, the optical director element including a curved reflective surface positioned and oriented to reflect laser light from the plurality of laser diodes toward the optical window of the cap, and to collimate the laser light along the respective fast axes of the laser light from the plurality of laser diodes. The light projector may also include at least one scan mirror positioned to receive laser light from the plurality of laser diodes and controllably orientable to redirect the laser light over a range of angles.

The WHUD may also include a processor communicatively coupled to the laser projector to modulate the generation of light signals. The laser projector may include a beam combiner positioned and oriented to combine light beams emitted from the plurality of laser diodes into a single aggregate beam. The WHUD may also include a transparent combiner carried by the support structure and positioned within a field of view of the user, in operation the transparent combiner may direct laser light from an output of the laser projector into the field of view of the user. The shape of the curved reflective surface of the optical director element may be defined by a parabolic cylinder. The parabolic cylinder may include a focal line, and the plurality of diodes may be positioned along an axis that is collinear with the focal line of the parabolic cylinder. The optical director element may include an edge adjacent to the plurality of laser diodes, the edge of the optical director element may be aligned with the focal line of the parabolic cylinder in a plane that is orthogonal to a top surface of the base substrate.

The optical engine of the laser projector may further include a plurality of chip submounts bonded to the base substrate, wherein each of the plurality of laser diodes are bonded to a corresponding one of the plurality of chip submounts to bond the laser diodes to the base substrate. The optical director element may include a mirror or a prism. The plurality of laser diodes may include a red laser diode to provide a red laser light, a green laser diode to provide a green laser light, a blue laser diode to provide a blue laser light, and an infrared laser diode to provide infrared laser light. The base substrate may be formed from at least one of low temperature co-fired ceramic (LTCC), aluminum nitride (AlN), alumina, or Kovar®.

The at least one laser diode driver circuit may be bonded to a first surface of the base substrate, and the plurality of laser diodes and the cap may be bonded to a second surface of the base substrate, the second surface of the base substrate opposite the first surface of the base substrate.

The at least one laser diode driver circuit, the plurality of laser diodes and the cap may be bonded to a first surface of the base substrate. The optical engine of the WHUD may further include: a plurality of electrical connections, each electrical connection operatively coupled to the at least one laser diode driver circuit and one respective laser diode of the plurality of laser diodes, each electrical connection positioned at least partially between the cap and the base substrate; and an electrically insulating cover positioned between each electrical connection and the cap.

The plurality of laser diodes and the cap may be bonded to a first surface of the base substrate, and the laser diode driver circuit may be separate from the base substrate. The optical engine of the WHUD may further include: a plurality of electrical contacts bonded to the first surface of the base substrate; a plurality of electrical connections, each electrical connection operatively coupled to one respective electrical contact of the plurality of electrical contacts and one respective laser diode of the plurality of laser diodes, each electrical connection positioned at least partially between the cap and the base substrate; and an electrically insulating cover positioned between each electrical connection and the cap, wherein the at least one laser diode driver circuit is operatively coupled to the plurality of electrical contacts.

The optical engine of the WHUD may further include a plurality of collimation lenses bonded to the optical window, and each of the plurality of collimation lenses may be positioned and oriented to receive light from a corresponding one of the plurality of laser diodes through the optical window. Each of the laser diodes may comprise one of an edge emitter laser or a vertical-cavity surface-emitting laser (VCSEL). The at least one wall of the cap may comprise at least one continuous sidewall having a lower first end and an upper second end, the lower first end bonded to the base substrate, and the optical window is hermetically sealed to the cap proximate the upper second end.

A laser projector may be summarized as including an optical engine and at least one scan mirror. The optical engine may include a base substrate; a plurality of laser diodes bonded to the base substrate; at least one laser diode driver circuit, the at least one laser diode driver circuit operatively coupled to the plurality of laser diodes to selectively drive current to the plurality of laser diodes; a cap including at least one wall and at least one optical window that together define an interior volume sized and dimensioned to receive at least the plurality of laser diodes, the cap being bonded to the base substrate to provide a hermetic or partially hermetic seal between the interior volume of the cap and a volume exterior to the cap, and the optical window positioned and oriented to allow light emitted from the plurality of laser diodes to exit the interior volume; and an optical director element bonded to the base substrate proximate the plurality of laser diodes within the interior volume, the optical director element including a curved reflective surface positioned and oriented to reflect laser light from the plurality of laser diodes toward the optical window of the cap, and to collimate the laser light along the respective fast axes of the laser light from the plurality of laser diodes. The at least one scan mirror may be positioned to receive laser light from the plurality of laser diodes and controllably orientable to redirect the laser light over a range of angles.

The laser projector may further include a beam combiner positioned and oriented to combine light beams emitted from the plurality of laser diodes into a single aggregate beam. The shape of the curved reflective surface of the optical director element may be defined by a parabolic cylinder. The parabolic cylinder may include a focal line, and the plurality of laser diodes may be positioned along an axis that is collinear with the focal line of the parabolic cylinder. The optical director element may include an edge adjacent to the plurality of laser diodes, and the edge of the optical director element may be aligned with the focal line of the parabolic cylinder in a plane that is orthogonal to a top surface of the base substrate.

The optical engine of the laser projector may further include a plurality of chip submounts bonded to the base substrate, wherein each of the plurality of laser diodes are bonded to a corresponding one of the plurality of chip submounts to bond the laser diodes to the base substrate. The optical director element may include a mirror or a prism. The plurality of laser diodes may include a red laser diode to provide a red laser light, a green laser diode to provide a green laser light, a blue laser diode to provide a blue laser light, and an infrared laser diode to provide infrared laser light. The base substrate may be formed from at least one of low temperature co-fired ceramic (LTCC), aluminum nitride (AlN), alumina, or Kovar®. The at least one laser diode driver circuit may be bonded to a first surface of the base substrate, and the plurality of laser diodes and the cap may be bonded to a second surface of the base substrate, the second surface of the base substrate opposite the first surface of the base substrate.

The at least one laser diode driver circuit, the plurality of laser diodes and the cap may be bonded to a first surface of the base substrate. The optical engine may further include: a plurality of electrical connections, each electrical connection operatively coupled to the at least one laser diode driver circuit and one respective laser diode of the plurality of laser diodes, each electrical connection positioned at least partially between the cap and the base substrate; and an electrically insulating cover positioned between each electrical connection and the cap.

The plurality of laser diodes and the cap may be bonded to a first surface of the base substrate, and the laser diode driver circuit may be separate from the base substrate. The optical engine of the laser projector may further include: a plurality of electrical contacts bonded to the first surface of the base substrate; a plurality of electrical connections, each electrical connection operatively coupled to one respective electrical contact of the plurality of electrical contacts and one respective laser diode of the plurality of laser diodes, each electrical connection positioned at least partially between the cap and the base substrate; and an electrically insulating cover positioned between each electrical connection and the cap, wherein the at least one laser diode driver circuit is operatively coupled to the plurality of electrical contacts.

The optical engine of the laser projector may further include a plurality of collimation lenses bonded to the optical window, and each of the plurality of collimation lenses may be positioned and oriented to receive light from a corresponding one of the plurality of laser diodes through the optical window. Each of the laser diodes may comprise one of an edge emitter laser or a vertical-cavity surface-emitting laser (VCSEL).

The at least one wall of the cap may comprise at least one continuous sidewall having a lower first end and an upper second end, the lower first end bonded to the base substrate, and the optical window is hermetically sealed to the cap proximate the upper second end.

A method of operating an optical engine that includes a plurality of laser diodes hermetically or partially hermetically sealed in an encapsulated package may be summarized as including causing the plurality of laser diodes to generate laser light; receiving the laser light from the laser diodes by at least one optical director element; redirecting, by the at least one optical director element, the received laser light toward an optical window of the encapsulated package; and collimating, by the at least one optical director element, laser light from the plurality of laser diodes along respective fast axes of the laser light.

The method may further include collimating, by a plurality of collimation lenses, the laser light from the laser diodes that exits the encapsulated package via the optical window. The method may further include combining, via a beam combiner, the plurality of laser light received from each of the collimation lenses into a single aggregate beam. Causing the plurality of laser diodes to generate laser light may include causing a red laser diode to generate red laser light, causing a green laser diode to generate green laser light, causing a blue laser diode to generate blue laser light, and causing an infrared laser diode to generate infrared laser light. Collimating laser light from the plurality of laser diodes may include collimating laser light from the plurality of laser diodes along respective fast axes of the laser light via the at least one optical director element that includes a curved reflective surface.

A method of manufacturing an optical engine may be summarized as including bonding an optical director element to a base substrate, the optical director element including a curved reflective surface and an edge, the edge aligned with a focal line of the curved reflective surface in a plane that is orthogonal to a top surface of the base substrate; bonding a plurality of laser diodes to the base substrate at respective positions wherein, for each of the plurality of laser diodes, an output facet thereof is positioned adjacent to the edge of the optical director element to align the output facet with the focal line of the curved reflective surface; operatively coupling at least one laser diode driver circuit to the plurality of laser diodes; and bonding a cap to the base substrate, the cap including at least one wall and at least one optical window that together define an interior volume sized and dimensioned to receive at least the plurality of laser diodes and the optical director element, the cap providing a hermetic or partially hermetic seal between the interior volume of the cap and a volume exterior to the cap, and the optical window positioned and oriented to allow light emitted from the plurality of laser diodes to exit the interior volume via the optical director element. Bonding an optical director element to a base substrate may include bonding an optical director element to the base substrate, and the shape of the curved reflective surface of the optical director element may be defined by a parabolic cylinder. Bonding a plurality of laser diodes to the base substrate at respective positions may include bonding each of the plurality of laser diodes to a corresponding one of a plurality of chip submounts, and bonding the plurality of chip submounts to the base substrate.

The method may further include bonding the at least one laser diode driver circuit to the base substrate. Operatively coupling at least one laser diode driver circuit to the plurality of laser diodes may include bonding a plurality of electrical connections to the base substrate, each electrical connection operatively coupling a respective laser diode to the at least one laser diode driver circuit. The method may further include bonding an electrically insulating cover to the base substrate over at least a portion of the plurality of electrical connections, and bonding a cap to the base substrate may include bonding at least a portion of the cap to the base substrate indirectly by bonding the at least a portion of the cap to the electrically insulating cover.

The method may further include: bonding a plurality of electrical contacts to the base substrate; and bonding a plurality of electrical connections to the base substrate, each electrical connection being operatively coupled to a respective laser diode of the plurality of laser diodes and to a respective electrical contact of the plurality of electrical contacts, and operatively coupling at least one laser diode driver circuit to the plurality of laser diodes may include operatively coupling the at least one laser diode driver circuit to the plurality of electrical contacts. The method may further include bonding an electrically insulating cover to the base substrate over at least a portion of the plurality of electrical connections, and bonding a cap to the base substrate may include bonding at least a portion of the cap to the base substrate indirectly by bonding the at least a portion of the cap to the electrically insulating cover.

The method may further include positioning a plurality of collimation lenses to the optical window, each of the plurality of collimation lenses positioned and oriented to receive light from a corresponding one of the plurality of laser diodes through the optical window. The method may further include positioning and orienting a beam combiner to combine light beams received from each of the collimation lenses into a single aggregate beam.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure provide laser-based optical engines, for example, laser-based optical engines for laser projectors used in wearable heads-up displays or other applications. Generally, the optical engines discussed herein integrate a plurality of laser dies or diodes (e.g., 3 laser diodes, 4 laser diodes) within a single, hermetically or partially hermetically sealed, encapsulated package. Such optical engines may have various advantages over existing designs including, for example, smaller volume, lower weight, better manufacturability, lower cost, faster modulation speed, etc. The material used for the optical engines discussed herein may be any suitable materials, e.g., ceramics with advantageous thermal properties, etc. As noted above, such features are particularly advantages in various applications including WHUDs.

Figure 1A:
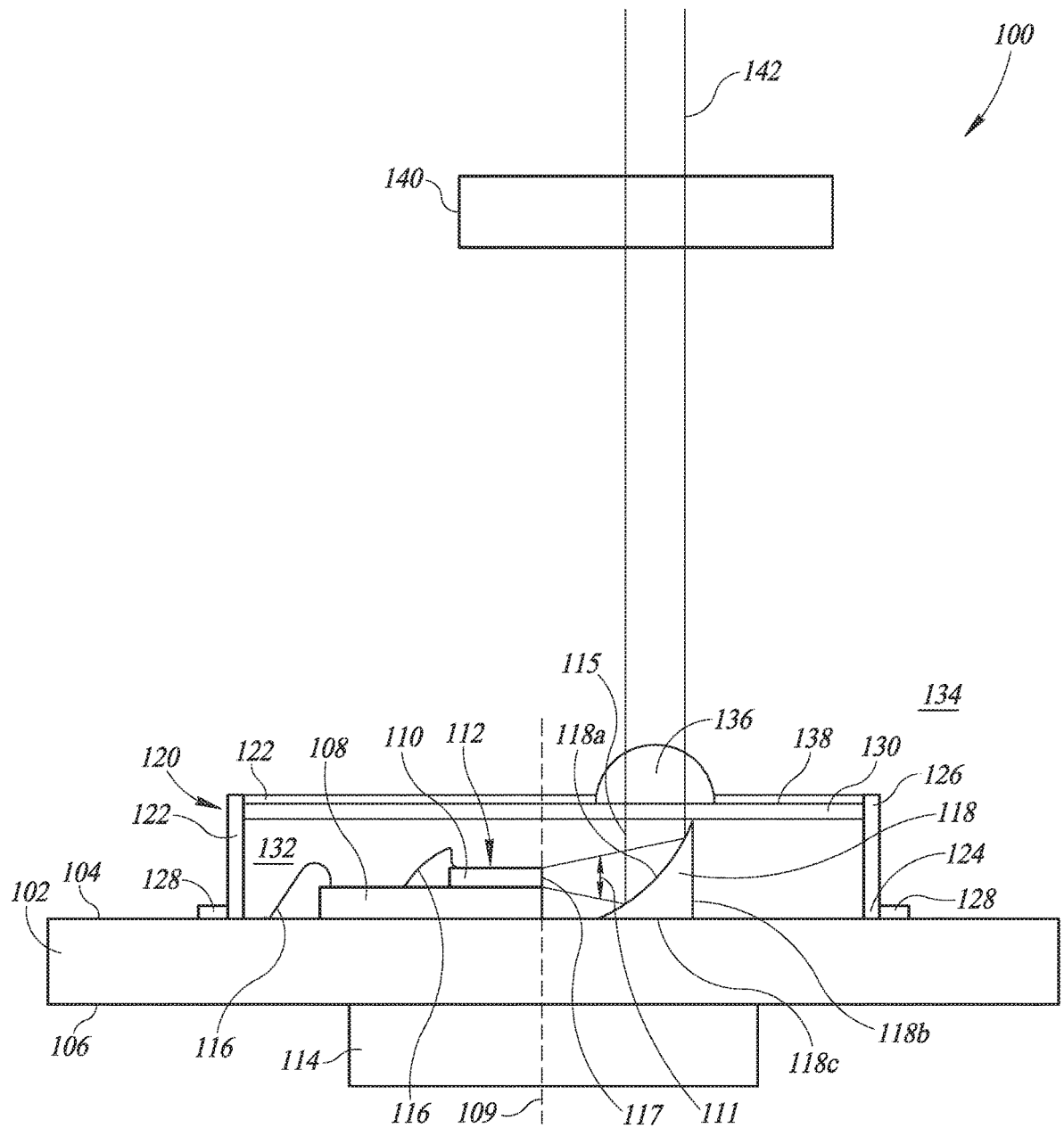
FIG. 1A is a left side, sectional elevational view of an optical engine, in accordance with the present systems, devices, and methods.
Figure 1B:
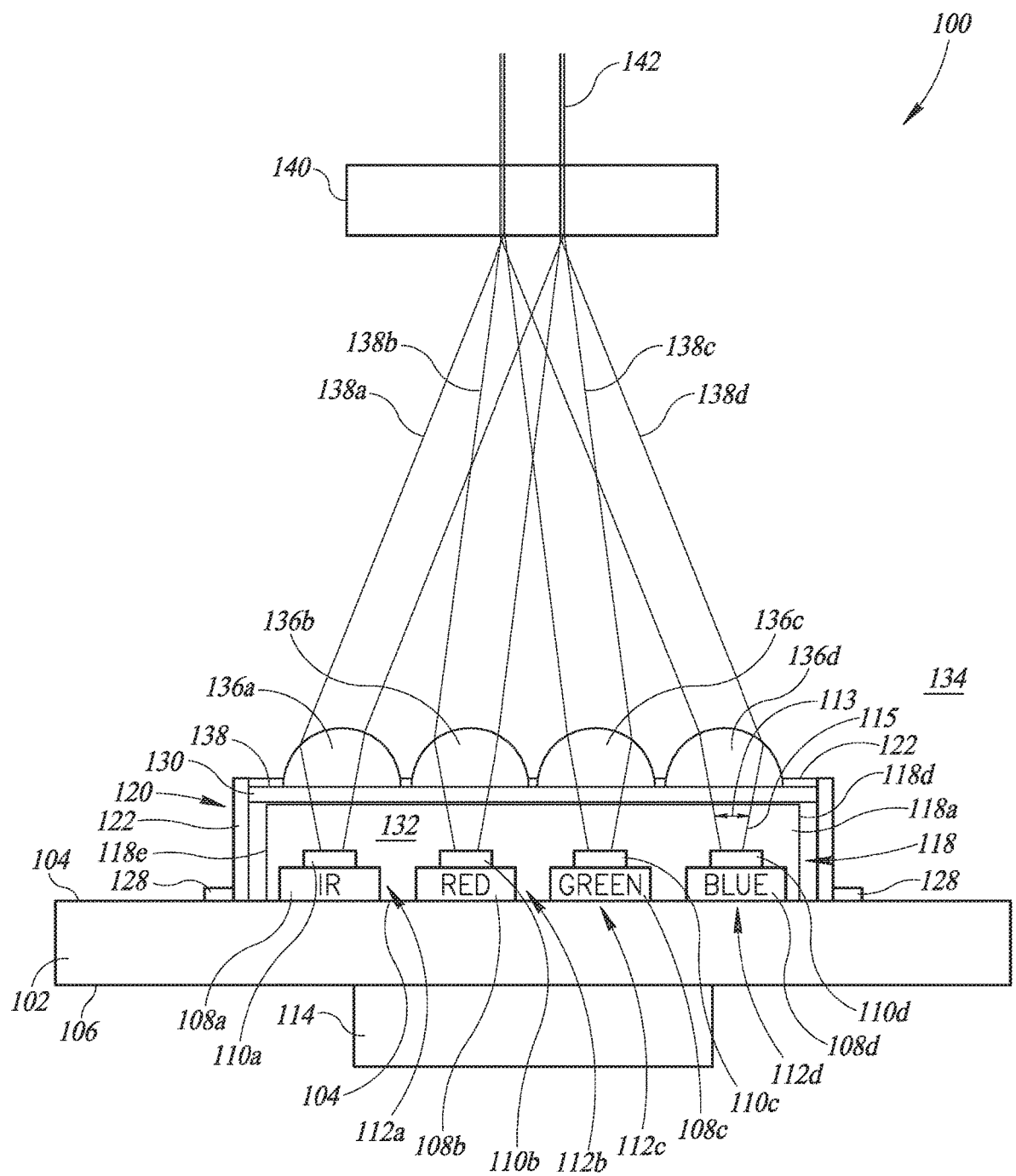
FIG. 1B is a front side, sectional elevational view of the optical engine also shown in FIG. 1A, in accordance with the present systems, devices, and methods.

FIG. 1A is a left side, elevational sectional view of an optical engine 100, which may also be referred to as a "multi-laser diode module" or an "RGB laser module," in accordance with the present systems, devices, and methods. FIG. 1B is a front side, elevational sectional view of the optical engine 100. The optical engine 100 includes a base substrate 102 having a top surface 104 and a bottom surface 106 opposite the top surface. The base substrate 102 may be formed from a material that is radio frequency (RF) compatible and is suitable for hermetic sealing. For example, the base substrate 102 may be formed from low temperature co-fired ceramic (LTCC), aluminum nitride (AlN), alumina, Kovar®, etc.

The optical engine 100 also includes a plurality of chip submounts 108a-108d (collectively 108) bonded (e.g., attached) to the top surface 104 of the base substrate 102. The plurality of chip submounts 108 are aligned in a row across a width of the optical engine 100 between the left and right sides thereof. Each of the plurality of chip submounts 108 includes a laser diode 110, also referred to as a laser chip or laser die, bonded thereto. In particular, an infrared chip submount 108a carries an infrared laser diode 110a, a red chip submount 108b carries a red laser diode 110b, a green chip submount 108c carries a green laser diode 110c, and a blue chip submount 108d carries a blue laser diode 110d. In operation, the infrared laser diode 110a provides infrared laser light, the red laser diode 110b, provides red laser light, the green laser diode 110c provides green laser light, and the blue laser diode 110d provides blue laser light. Each of the laser diodes 110 may comprise one of an edge emitter laser or a vertical-cavity surface-emitting laser (VCSEL), for example. Each of the four laser diode/chip submount pairs may be referred to collectively as a "laser chip on submount," or a laser CoS 112. Thus, the optical engine 100 includes an infrared laser CoS 112a, a red laser CoS 112b, a green laser CoS 112c, and a blue laser CoS 112d. In at least some implementations, one or more of the laser diodes 110 may be bonded directly to the base substrate 102 without use of a submount 108, as shown in the example provided in FIG. 6, discussed below.

The optical engine 100 also includes a laser diode driver circuit 114 bonded to the bottom surface 106 of the base substrate 102. The laser diode driver circuit 114 is operatively coupled to the plurality of laser diodes 110 via suitable electrical connections 116 to selectively drive current to the plurality of laser diodes. In at least some implementations, the laser diode driver circuit 114 may be positioned relative to the CoSs 112 to minimize the distance between the laser diode driver circuit 114 and the CoSs 112. Although not shown in FIGS. 1A and 1B, the laser diode driver circuit 114 may be operatively coupleable to a controller (e.g., microcontroller, microprocessor, ASIC) which controls the operation of the laser diode driver circuit 114 to selectively modulate laser light emitted by the laser diodes 110. In at least some implementations, the laser diode driver circuit 114 may be bonded to another portion of the base substrate 102, such as the top surface 104 of the base substrate. In at least some implementations, the laser diode driver circuitry 114 may be remotely located and operatively coupled to the laser diodes 110. In order to not require the use of impedance matched transmission lines, the size scale may be small compared to a wavelength (e.g., lumped element regime), where the electrical characteristics are described by (lumped) elements like resistance, inductance, and capacitance.

Proximate the laser diodes 110 there is positioned an optical director element 118. Like the chip submounts 108, the optical director element 118 is bonded to the top surface 104 of the base substrate 102. The optical director element 118 may be bonded proximate to or adjacent each of the chip submounts 108. In the illustrated example, the optical director element 118 has a curved reflective surface and includes a plurality of planar faces. In particular, the optical director element 118 includes a curved reflective surface 118a that extends along the width of the optical engine 100, a rear face 118b, a bottom face 118c that is bonded to the top surface 104 of the base substrate 102, a left face 118d, and a right face 118e opposite the left face. The optical director element 118 may comprise a mirror or a prism, for example.

The optical engine 100 also includes a cap 120 that includes a vertical sidewall 122 having a lower first end 124 and an upper second end 126 opposite the first end. A flange 128 may be disposed around a perimeter of the sidewall 122 adjacent the lower first end 124. Proximate the upper second end 126 of the sidewall 122 there is a horizontal optical window 130 that forms the "top" of the cap 120. The sidewall 122 and the optical window 130 together define an interior volume 132 sized and dimensioned to receive the plurality of chip submounts 108, the plurality of laser diodes 110, and the optical director element 118. The lower first end 124 and the flange 128 of the cap 120 are bonded to the base substrate 102 to provide a hermetic or partially hermetic seal between the interior volume 132 of the cap and a volume 134 exterior to the cap.

Figure 7:
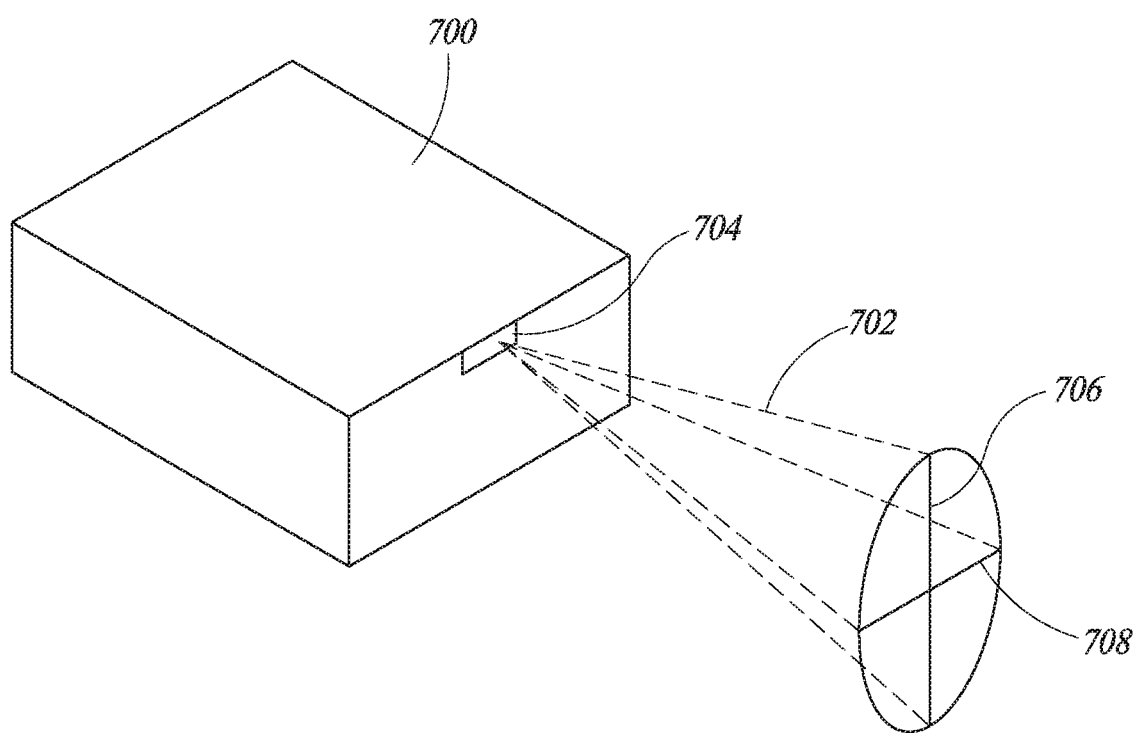
FIG. 7 is an isometric view of a laser diode, showing a fast axis and a slow axis of a light beam generated by the laser diode, in accordance with the present systems, devices, and methods.

As shown best in FIG. 1A, the optical director element 118 is positioned and oriented to direct (e.g., reflect) laser light received from each of the plurality of laser diodes 110 upward (as shown) toward the optical window 130 of the cap 120, wherein the laser light exits the interior volume 132. The laser light emitted by each of the laser diodes 110 includes a fast axis 111 (FIG. 1A) and a slow axis 113 (FIG. 1B) orthogonal to the fast axis. As shown in FIG. 1A, the curved reflective surface 118a of the optical director element 118 collimates the laser light along the respective fast axes 111 of the laser light received from the plurality of laser diodes 110, such that laser light 115 reflected upward toward the optical window 130 by the curved reflective surface is collimated along the fast axis of each of the respective light beams. FIG. 7, discussed below, illustrates an example laser diode, such as one of the laser diodes 110, showing a fast axis and a slow axis of a light beam generated by the laser diode. Although the optical director element 118 is shown as a single element that collimates the light from each of the laser diodes, in at least some implementations individual collimators (fast and slow axis) may be provided for each of the laser diodes. For example, the optical director element 118 may be replaced with a row of four fast axis collimators, or four fast axis collimators may be positioned to collimate light beams from the four laser diodes 110 before or after the light beams are directed by the optical director element 118.

In at least some implementations, the shape of the curved reflective surface 118a of the optical director element 118 may be defined by a parabolic cylinder (e.g., a section of a cylinder having a cross section that is a parabola), such as an off-axis parabolic cylinder. For at least some implementations, the shape of the curved reflective surface 118a may be referred to as a "single curvature" or "2D curvature" surface, for example. In at least some implementations, an output facet 117 of each of the laser diodes 110 may be aligned with a focal line of the parabolic cylinder. For example, the output facets 117 of each of the laser diodes 110 may be aligned along an axis 109 (FIG. 1A) that is collinear with the focal line of the parabolic cylinder formed by the curved reflective surface 118a, which causes the optical director element 118 to collimate light emitted by the laser diodes 110 along the fast axis of each of the beams of light. This feature reduces the external dimensions of the required optics and allows for better circularization of the beams of laser light.

The cap 120 may have a round shape, rectangular shape, or other shape. Thus, the vertical sidewall 122 may comprise a continuously curved sidewall, a plurality (e.g., four) of adjacent planar portions, etc. The optical window 130 may comprise an entire top of the cap 120, or may comprise only a portion thereof. In at least some implementations, the optical window 130 may be located on the sidewall 122 rather than positioned as a top of the cap 120, and the laser diodes 110 and/or the optical director element 118 may be positioned and oriented to direct the laser light from the laser diodes toward the optical window on the sidewall 122. In at least some implementations, the cap 120 may include a plurality of optical windows instead of a single optical window.

The optical engine 100 also includes four collimation/pointing lenses 136a-136d (collectively 136), one for each of the four laser diodes 110a-136d, respectively, that are bonded to a top surface 138 of the optical window 130. Each of the plurality of collimation lenses 136 is positioned and oriented to receive light from a corresponding one of the laser diodes 110 through the optical window 130. In particular, the collimation lens 136a receives light from the infrared laser diode 110a via the optical director element 118 and the optical window 130, the collimation lens 136b receives light from the red laser diode 110b, via the optical director element and the optical window, the collimation lens 136c receives light from the green laser diode 110c via the optical director element and the optical window, and the collimation lens 136d receives light from the blue laser diode 110d via the optical director element and the optical window.

Each of the collimation lenses 136 is operative to receive laser light from a respective one of the laser diodes 110, and to generate a single color beam. In particular, the collimation lens 136a receives infrared laser light from the infrared laser diode 110a and produces an infrared laser beam 138a, the collimation lens 136b receives red laser light from the red laser diode 110b, and produces a red laser beam 138b, the collimation lens 136c receives green laser light from the green laser diode 110c and produces a green laser beam 138c, and the collimation lens 136d receives blue laser light from the blue laser diode 110d and produces a blue laser beam 138d.

Figure 3:
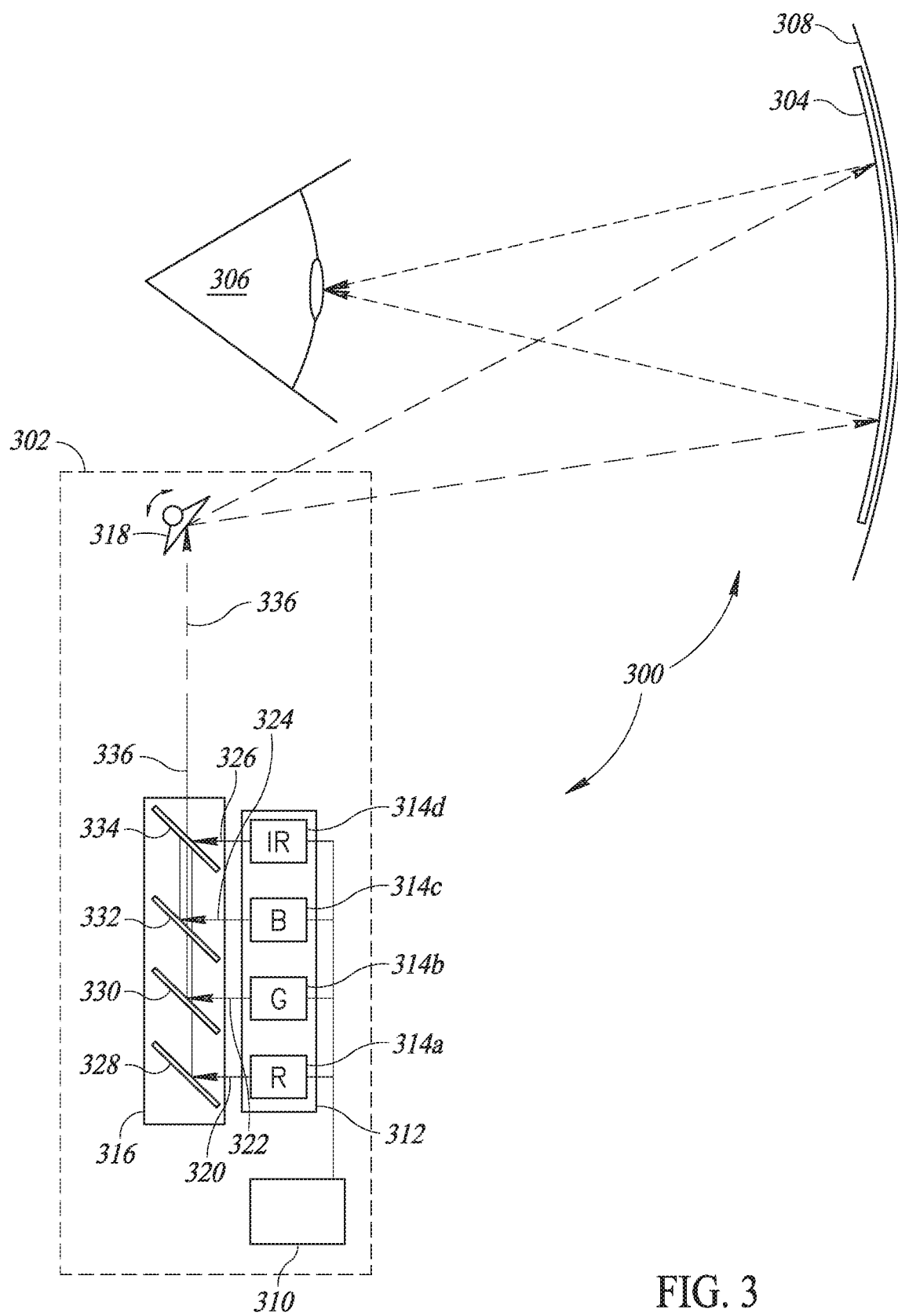
FIG. 3 is a schematic diagram of a wearable heads-up display with a laser projector that includes an optical engine, and a transparent combiner in a field of view of an eye of a user, in accordance with the present systems, devices, and methods.

The optical engine 100 may also include, or may be positioned proximate to, a beam combiner 140 that is positioned and oriented to combine the light beams 138a-138d received from each of the collimation lenses 136 into a single aggregate beam 142. As an example, the beam combiner 140 may include one or more diffractive optical elements (DOE) and/or one or more refractive/reflective optical elements that combine the different color beams 138a-138d in order to achieve coaxial superposition. An example beam combiner is shown in FIG. 3 and discussed below.

In at least some implementations, the laser CoSs 112, the optical director element 118, and/or the collimation lenses 136 may be positioned differently. As noted above, laser diode driver circuit 114 may be mounted on the top surface 104 or the bottom surface 106 of the base substrate 102, depending on the RF design and other constraints (e.g., package size). In at least some implementations, the optical engine 100 may not include the optical director element 118, and the laser light may be directed from the laser diodes 110 toward the collimation lenses 136 without requiring an intermediate optical director element. Additionally, in at least some implementations, one or more of the laser diodes may be mounted directly on the base substrate 102 without use of a submount.

For the sake of a controlled atmosphere inside the interior volume 132, it may be desirable to have no organic compounds inside the interior volume 132. In at least some implementations, the components of the optical engine 100 may be bonded together using no adhesives. In other implementations, a low amount of adhesives may be used to bond at least one of the components, which may reduce cost while providing a relatively low risk of organic contamination for a determined lifetime (e.g., 2 or more years) of the optical engine 100. The use of adhesives may result in a partially hermetic seal, but this partially hermetic seal may be acceptable in certain applications. In one example application, even in an environment with only partial hermiticity, the life of laser diodes 110 and transparency of optical window 130 may be maintained longer than the life of a battery of a device, such that partial hermiticity may be acceptable for the devices. In some cases, even protecting interior volume 132 from particulate with a dust cover may be sufficient to maintain laser diodes 110 and transparency of optical window 130 for the intended lifespan of the device. In some cases, laser diodes 110 and transparency of optical window 130 may last for the intended lifespan of the device even without a protective cover. Various bonding processes (e.g., attaching processes) for the optical engine 100 are discussed below with reference to FIG. 5.

Figure 2:
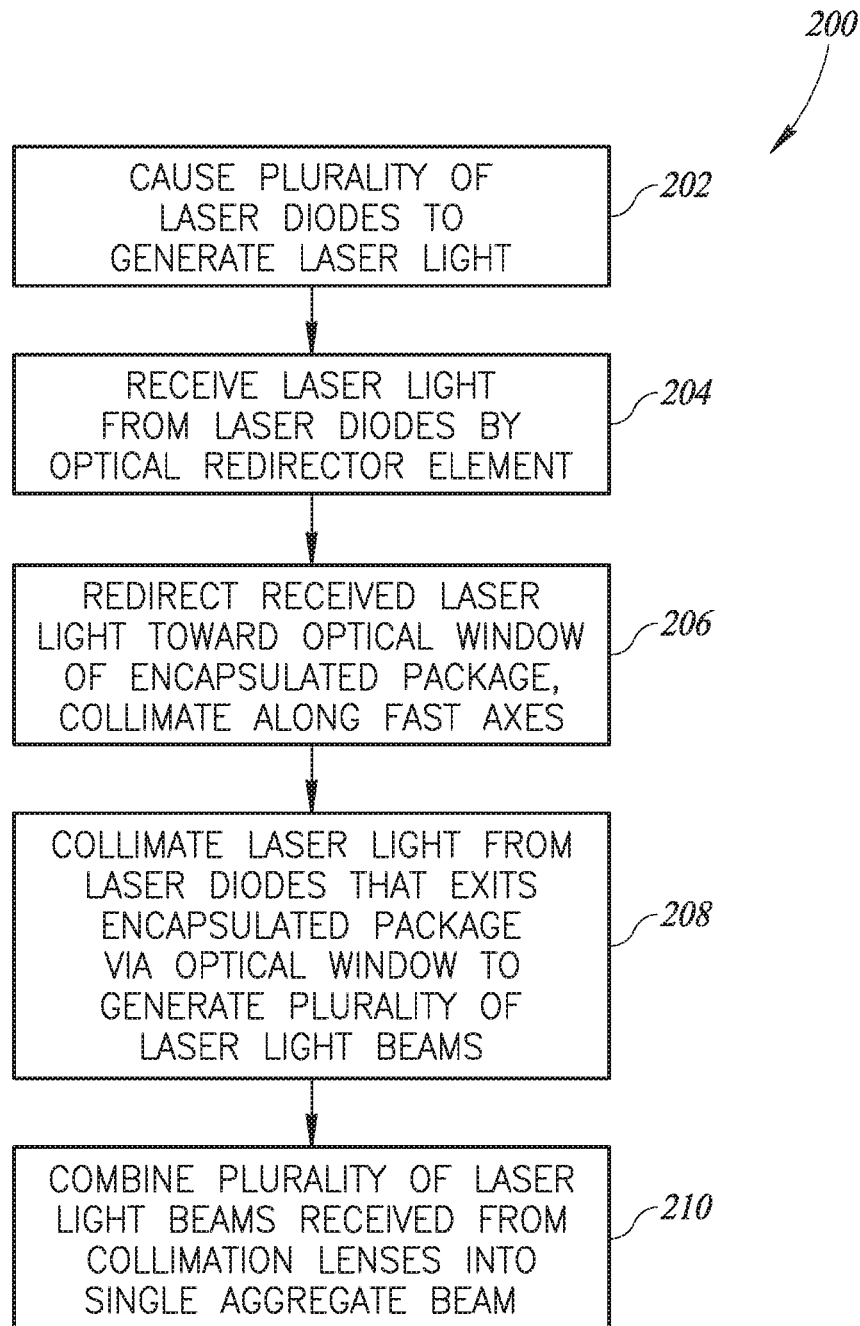
FIG. 2 is a flow diagram of a method of operating an optical engine, in accordance with the present systems, devices, and methods.

FIG. 2 is a flow diagram of a method 200 of operating an optical engine, in accordance with the present systems, devices, and methods. The method 200 may be implemented using the optical engine 100 of FIGS. 1A-1B, for example. It should be appreciated that methods of operating optical engines according to the present disclosure may include fewer or additional acts than set forth in the method 200. Further, the acts discussed below may be performed in an order different than the order presented herein.

At 202, at least one controller may cause a plurality of laser diodes of an optical engine to generate laser light. As discussed above, the plurality of laser diodes may be hermetically or partially hermetically sealed in an encapsulated package. The laser diodes may produce light sequentially and/or simultaneously with each other. At 204, at least one optical director element may receive the laser light from the laser diodes. The optical director element may comprise a mirror or a prism, for example. As discussed above, in at least some implementations the optical engine may be designed such that laser light exits the optical engine without use of an optical director element.

At 206, the at least one optical director element may direct the received laser light toward an optical window of the encapsulated package. For example, the optical director element may reflect the received laser light toward the optical window of the encapsulated package. As discussed above, the optical director element may include a curved surface that collimates the fast axis of the laser light emitted by the plurality of diodes.

At 208, a plurality of collimation lenses may collimate the laser light from the laser diodes that exits the encapsulated package via the optical window to generate a plurality of differently colored laser light beams. The collimation lenses may be positioned inside or outside of the encapsulated package. As an example, the collimation lenses may be physically coupled to the optical window of the encapsulated package.

At 210, a beam combiner may combine the plurality of laser light beams received from each of the collimation lenses into a single aggregate beam. The beam combiner may include one or more diffractive optical elements (DOE) that combine different color beams in order to achieve coaxial superposition, for example. The beam combiner may include one or more DOEs and/or one or more refractive/reflective optical elements. An example beam combiner is shown in FIG. 3 and discussed below.

FIG. 3 is a schematic diagram of a wearable heads-up display (WHUD) 300 with an exemplary laser projector 302, and a transparent combiner 304 in a field of view of an eye 306 of a user of the WHUD, in accordance with the present systems, devices, and methods. The WHUD 300 includes a support structure (not shown), with the general shape and appearance of an eyeglasses frame, carrying an eyeglass lens 308 with the transparent combiner 304, and the laser projector 302.

The laser projector 302 comprises a controller or processor 310, an optical engine 312 comprising four laser diodes 314a, 314b, 314c, 314d (collectively 314) communicatively coupled to the processor 310, a beam combiner 316, and a scan mirror 318. The optical engine 312 may be similar or identical to the optical engine 100 discussed above with reference to FIGS. 1A and 1B. Generally, the term "processor" refers to hardware circuitry, and may include any of microprocessors, microcontrollers, application specific integrated circuits (ASICs), digital signal processors (DSPs), programmable gate arrays (PGAs), and/or programmable logic controllers (PLCs), or any other integrated or non-integrated circuit.

During operation of the WHUD 300, the processor 310 modulates light output from the laser diodes 314, which includes a first red laser diode 314a (R), a second green laser diode 314b (G), a third blue laser diode 314c (B), and a fourth infrared laser diode 314d (IR). The first laser diode 314a emits a first (e.g., red) light signal 320, the second laser diode 314b emits a second (e.g., green) light signal 322, the third laser diode 314c emits a third (e.g., blue) light signal 324, and the fourth laser diode 314d emits a fourth (e.g., infrared) light signal 326. All four of light signals 320, 322, 324, and 326 enter or impinge on the beam combiner 316. Beam combiner 316 could for example be based on any of the beam combiners described in U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,282, (U.S. Publication Number 2018/0210213), and/or U.S. Non-Provisional patent application Ser. No. 15/852,205 (U.S. Publication Number 2018/0210216).

In the illustrated example, the beam combiner 316 includes optical elements 328, 330, 332, and 334. The first light signal 320 is emitted towards the first optical element 328 and reflected by the first optical element 328 of the beam combiner 316 towards the second optical element 330 of the beam combiner 316. The second light signal 322 is also directed towards the second optical element 330. The second optical element 330 is formed of a dichroic material that is transmissive of the red wavelength of the first light signal 320 and reflective of the green wavelength of the second light signal 322. Therefore, the second optical element 330 transmits the first light signal 320 and reflects the second light signal 322. The second optical element 330 combines the first light signal 320 and the second light signal 322 into a single aggregate beam (shown as separate beams for illustrative purposes) and routes the aggregate beam towards the third optical element 332 of the beam combiner 316.

The third light signal 324 is also routed towards the third optical element 332. The third optical element 332 is formed of a dichroic material that is transmissive of the wavelengths of light (e.g., red and green) in the aggregate beam comprising the first light signal 320 and the second light signal 322 and reflective of the blue wavelength of the third light signal 324. Accordingly, the third optical element 332 transmits the aggregate beam comprising the first light signal 320 and the second light signal 322 and reflects the third light signal 324. In this way, the third optical element 332 adds the third light signal 324 to the aggregate beam such that the aggregate beam comprises the light signals 320, 322, and 324 (shown as separate beams for illustrative purposes) and routes the aggregate beam towards the fourth optical element 334 in the beam combiner 316.

The fourth light signal 326 is also routed towards the fourth optical element 334. The fourth optical element 334 is formed of a dichroic material that is transmissive of the visible wavelengths of light (e.g., red, green, and blue) in the aggregate beam comprising the first light signal 320, the second light signal 322, and the third light signal 324 and reflective of the infrared wavelength of the fourth light signal 326. Accordingly, the fourth optical element 334 transmits the aggregate beam comprising the first light signal 320, the second light signal 322, and the third light signal 324 and reflects the fourth light signal 326. In this way, the fourth optical element 334 adds the fourth light signal 326 to the aggregate beam such that the aggregate beam 336 comprises portions of the light signals 320, 322, 324, and 326. The fourth optical element 334 routes the aggregate beam 336 towards the controllable scan mirror 318.

The scan mirror 318 is controllably orientable and scans (e.g. raster scans) the beam 336 to the eye 306 of the user of the WHUD 300. In particular, the controllable scan mirror 318 scans the laser light onto the transparent combiner 304 carried by the eyeglass lens 308. The scan mirror 318 may be a single bi-axial scan mirror or two single-axis scan mirrors may be used to scan the laser light onto the transparent combiner 304, for example. In at least some implementations, the transparent combiner 304 may be a holographic combiner with at least one holographic optical element. The transparent combiner 304 redirects the laser light towards a field of view of the eye 306 of the user. The laser light redirected towards the eye 306 of the user may be collimated by the transparent combiner 304, wherein the spot at the transparent combiner 304 is approximately the same size and shape as the spot at the eye 306 of the user. The laser light may be converged by the eye 306 to a focal point at the retina of eye 306 and creates an image that is focused. The visible light may create display content in the field of view of the user, and the infrared light may illuminate the eye 306 of the user for the purpose of eye tracking.

Figure 4:
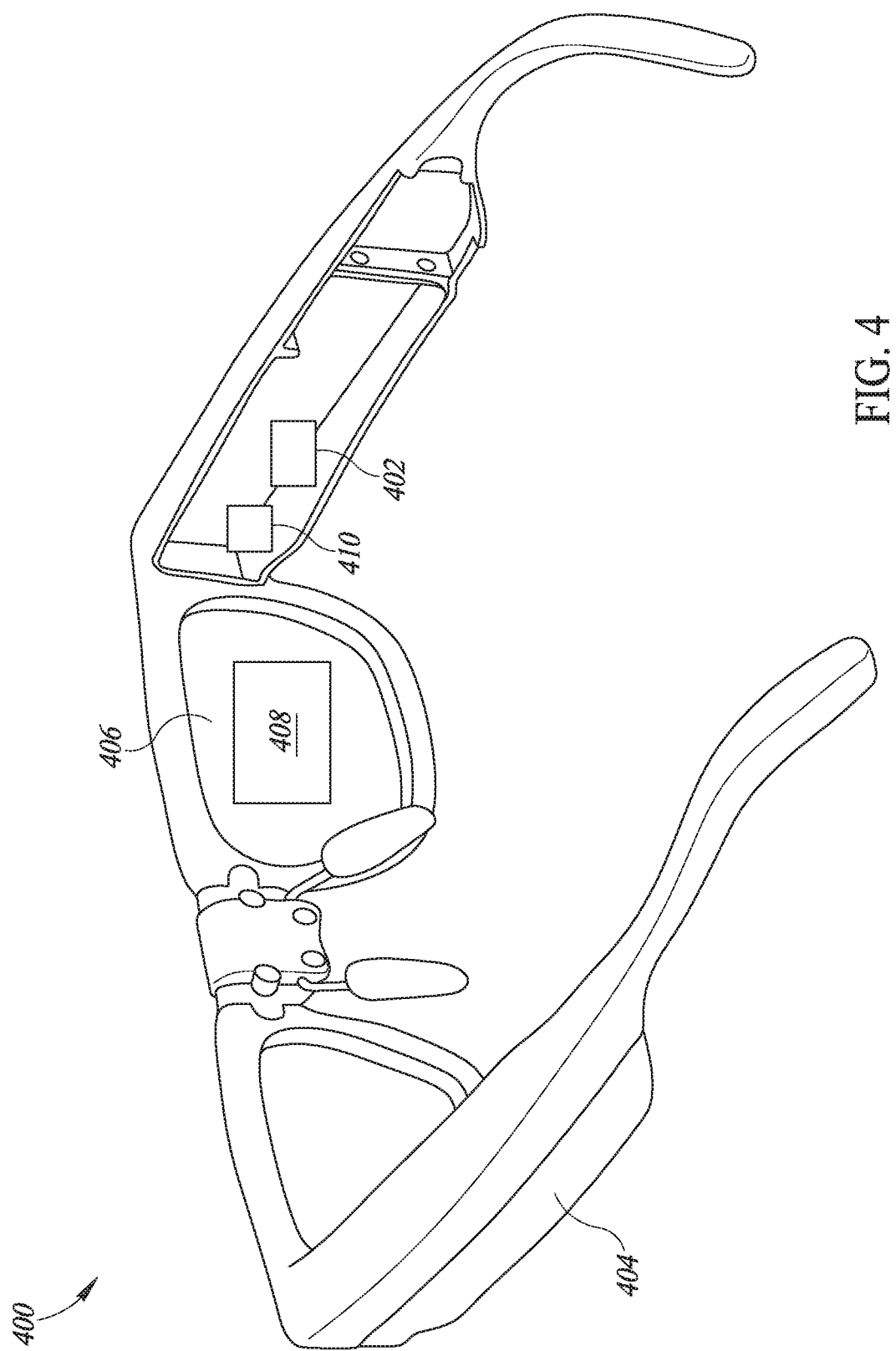
FIG. 4 is an isometric view of a wearable heads-up display with a laser projector that includes an optical engine, in accordance with the present systems, devices, and methods.

FIG. 4 is a schematic diagram of a wearable heads-up display (WHUD) 400 with a laser projector 402 in accordance with the present systems, devices, and methods. WHUD 400 includes a support structure 404 with the shape and appearance of a pair of eyeglasses that in use is worn on the head of the user. The support structure 404 carries multiple components, including eyeglass lens 406, a transparent combiner 408, the laser projector 402, and a controller or processor 410. The laser projector 402 may be similar or identical to the laser projector 302 of FIG. 3. For example, the laser projector 402 may include an optical engine, such as the optical engine 100 or the optical engine 312. The laser projector 402 may be communicatively coupled to the controller 410 (e.g., microprocessor) which controls the operation of the projector 402, as discussed above. The controller 410 may include or may be communicatively coupled to a non-transitory processor-readable storage medium (e.g., memory circuits such as ROM, RAM, FLASH, EEPROM, memory registers, magnetic disks, optical disks, other storage), and the controller may execute data and/or instruction from the non-transitory processor readable storage medium to control the operation of the laser projector 402.

In operation of the WHUD 400, the controller 410 controls the laser projector 402 to emit laser light. As discussed above with reference to FIG. 3, the laser projector 402 generates and directs an aggregate beam (e.g., aggregate beam 336 of FIG. 3) toward the transparent combiner 408 via at least one controllable mirror (not shown in FIG. 4). The aggregate beam is directed towards a field of view of an eye of a user by the transparent combiner 408. The transparent combiner 408 may collimate the aggregate beam such that the spot of the laser light incident on the eye of the user is at least approximately the same size and shape as the spot at transparent combiner 408. The transparent combiner 408 may be a holographic combiner that includes at least one holographic optical element.

Figure 5:
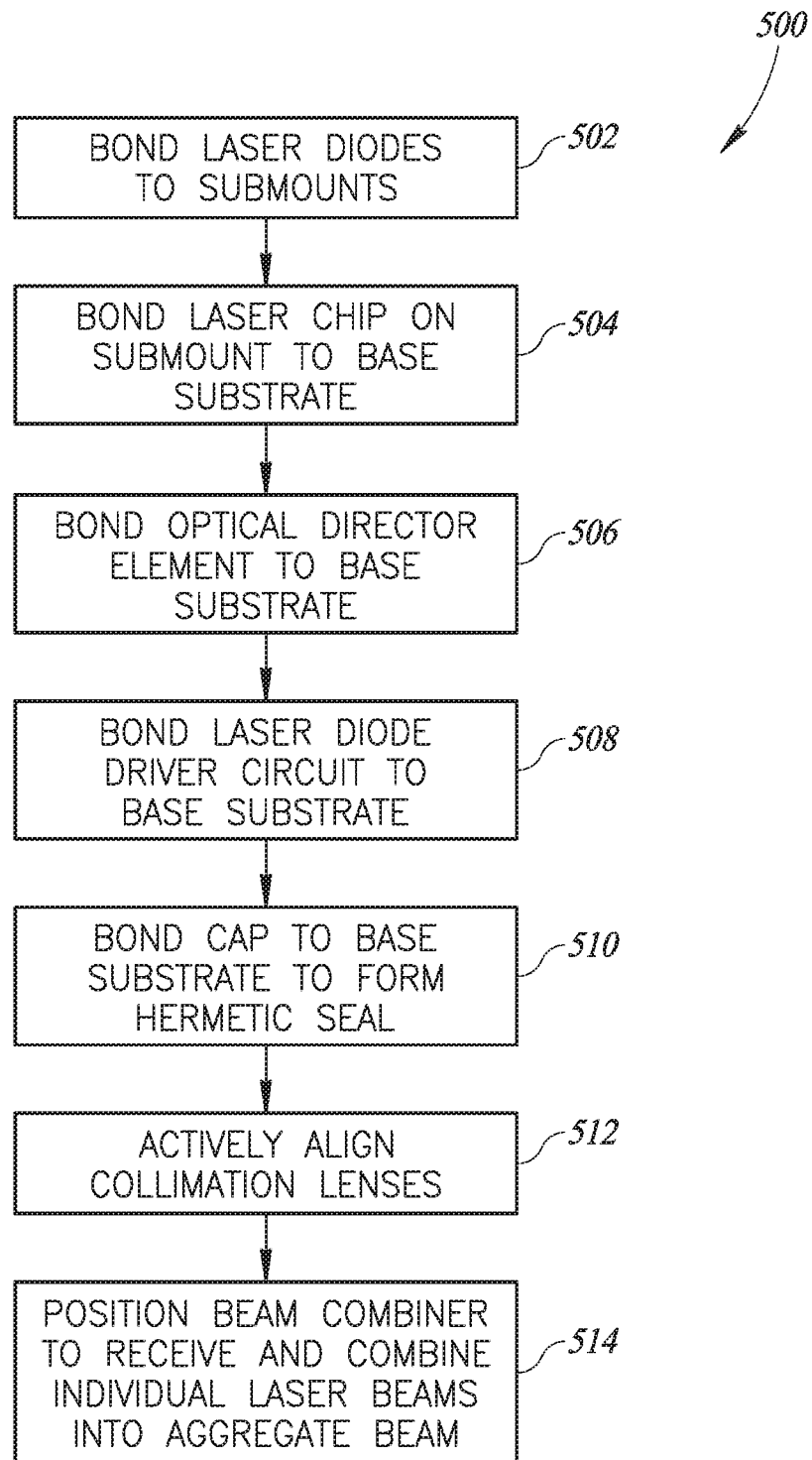
FIG. 5 is a flow diagram of a method of manufacturing an optical engine, in accordance with the present systems, devices, and methods.

FIG. 5 is a flow diagram of a method 500 of manufacturing an optical engine, in accordance with the present systems, devices, and methods. The method 500 may be implemented to manufacture the optical engine 100 of FIGS. 1A-1B or the optical engine 312 of FIG. 3, for example. It should be appreciated that methods of manufacturing optical engines according to the present disclosure may include fewer or additional acts than set forth in the method 500. Further, the acts discussed below may be performed in an order different than the order presented herein.

At 502, a plurality of laser diodes may be bonded to a respective plurality of submounts. In at least some implementations, this method may be performed by an entity different than that manufacturing the optical engine. For example, in at least some implementations, one or more of the plurality of laser diodes (e.g., green laser diode, blue laser diode) may be purchased as already assembled laser CoSs. For ease of handling and simplification of the overall process, in at least some implementations it may be advantageous to also bond laser diodes that cannot be procured on submounts to a submount as well. As a non-limiting example, in at least some implementations, one or more of the laser diodes may be bonded to a corresponding submount using an eutectic gold tin (AuSn) solder process, which is flux-free and requires heating up top 280° C.

At 504, the plurality of CoSs may be bonded to a base substrate. Alternatively, act 502 could be skipped for at least one or all of the laser diodes, and act 504 could comprise bonding the at least one or all of the laser diodes directly to the base substrate, such as discussed later with regards to FIG. 9. The base substrate may be formed from a material that is RF compatible and is suitable for hermetic sealing. For example, the base substrate may be formed from low temperature co-fired ceramic (LTCC), aluminum nitride (AlN), alumina, Kovar®, etc. Since several CoSs are bonded next to each other on the same base substrate, it may be advantageous to either "step-solder" them sequentially or to use a bonding technique that does not rely on re-melting of solder materials. For step-soldering, each subsequent soldering step utilizes a process temperature that is less than the process temperatures of previous solder steps to prevent re-melting of solder materials. It may also be important that the laser diode-to-submount bonding does not re-melt during bonding of the CoSs to the base substrate. Bonding technologies other than step-soldering that may be used include parallel soldering of all CoS in reflow oven process, thermosonic or thermocompression bonding, transient liquid phase (TLP) bonding, laser soldering, etc. Some of these example bonding technologies are discussed below.

For parallel soldering of all CoSs in a reflow oven process, appropriate tooling is required to assure proper bonding and alignment during the process. An advantage of this process is the parallel and hence time efficient bonding of all CoSs at once and even many assemblies in parallel. A possible disadvantage of this process is the potential loss of the alignment of components during the reflow process. Generally, a soldering cycle ideally needs a few minutes of dwell time. Preheating may be used to reduce the soldering time, which requires a few minutes for such a process depending on the thermal mass of the components being bonded. Thus, a batch process may be used with regular soldering to reduce the assembly costs with high throughput at the expense of alignment tolerance.

For thermosonic or thermocompression bonding, thick gold metallization may be used but no extra solder layer is required. The temperatures for thermocompression bonding might be as high as 300 to 350° C. to have a good bond with a good thermal conductivity. Thermosonic bonding may be used to reduce the pressure and temperature needed for bonding, which may be required for at least some components that might not tolerate the temperatures required for thermocompression bonding.

Transient liquid phase (TLP) bonding may also be used. There are many different reaction couples that may be used, including gold-tin, copper-tin, etc. With this method, a liquid phase is formed during the bonding which will solidify at the same temperature. The re-melting temperatures of the bond are much higher than the soldering temperatures.

In at least some implementations, laser soldering may be used to bond some or all of the components of the optical engine. Generally, the thermal characteristic of the parts to be bonded may be important when implementing a laser soldering process.

Subsequent reflows of solder are not recommended due to liquid phase reaction or dissolution mechanisms which may reduce the reliability of the joint. This could result in voiding at the interface or a reduction in strength of the joint itself. In order to mitigate potential reflow dissolution problems, other options can be taken into consideration, which do not rely on extreme heating of the device and can be favorable in terms of production cost. For example, bonding of the base substrate with adhesives (electrically conductive for common mass, or non-conductive for floating) may be acceptable with respect to heat transfer and out-gassing as discussed regarding partial hermetic sealing above.

Further, in at least some implementations, a reactive multi-layer foil material (e.g., NanoFoil®) or a similar material may be used as a solder pre-form, which enables localized heat transfer. A reactive multi-layer foil material is a metallic material based on a plurality (e.g., hundreds, thousands) of reactive foils (aluminum and nickel) that enables die-attach soldering (e.g., silicon chip onto stainless steel part). In such implementations, dedicated heat transfer support metallizations may be deposited onto the two components being joined together. This method may be more advantageous for CoS-to-base substrate mounting compared to chip-to-submount bonding. Generally, bonding using reactive multi-layer foil materials enables furnace-free, low-temperature soldering of transparent or non-transparent components, without reaching the bonding temperatures for solder reflow processes. Reactive multi-layer foil materials can be patterned with a ps-laser into exact preform shapes.

At 506, the optical director element may be bonded to the base substrate proximate the laser CoSs. The optical director element may be bonded to the base substrate using any suitable bonding process, including the bonding processes discussed above with reference to act 504.

At 508, the laser diode driver circuit may optionally be bonded to the base substrate. As noted above, the laser diode driver circuit may be bonded to the base substrate such that the distance between the laser diode driver circuit and the laser CoSs is minimized. This may also comprise positioning a plurality of electrical connections which operatively couple the laser diode driver circuit to the plurality of laser diodes. In alternative implementations, the laser diode driver circuit may be bonded to a separate base substrate from the other components mentioned above. The process used to bond the laser diode driver circuit to a base substrate may be any suitable bonding process, such as bonding processes commonly used to bond surface mount devices (SMD) to circuit boards. In other alternative implementations, the laser diode driver circuit may be mounted directly to a frame of a WHUD. For implementations where the laser diode drive circuit is not bonded to the same base substrate as the other components mentioned above, a plurality of electrical contacts and electrical connections could be bonded to the base substrate, each electrical connection operatively connecting a respective electrical contact to a respective laser diode. Subsequently, the at least one laser driver circuit could be operatively coupled to the electrical contacts, which will then electrically couple the laser diode drive circuit to the electrical connections and consequently to the laser diodes. An exemplary arrangement of electrical connections and electrical contacts is discussed later with reference to FIG. 10B.

At 510, the cap may be bonded to the base substrate to form a hermetic or partially hermetic seal as discussed above between the interior volume of the encapsulated package and an exterior environment. As noted above, it may be desirable to maintain a specific atmosphere for the laser diode chips for reliability reasons. In at least some implementations, adhesive sealing may be undesirable because of the high permeability of gases. This is especially the case for blue laser diodes, which emit blue laser light that may bake contamination on facets and windows, thereby reducing transparency of the optical window. However, as detailed above regarding FIGS. 1A and 1B, partial hermeticity, a particulate dust cover, or even no protective cover may be acceptable for certain applications. In implementations where the cap would be bonded over electrical connections which connect the at least one laser diode driver circuit to the plurality of laser diodes, such as when the at least one laser diode driver circuit is bonded to the same side of a base substrate as the laser diodes, or when the at least one laser diode driver circuit is coupled to electrical contacts bonded to the same side of the base substrate as the laser diodes, an electrically insulating cover can first be bonded to the base substrate over the electrical connections. Subsequently, the cap can be bonded at least partially to the electrically insulating cover, and potentially to a portion of the base substrate if the insulating cover does not fully encircle the intended interior volume. In this way, at least a portion of the cap will be bonded to the base substrate indirectly by being bonded to the electrically insulating cover. In some implementations, the entire cap could be bonded to the base substrate indirectly by being bonded to an electrically insulating cover which encircles the intended interior volume. Exemplary electrically insulating covers are discussed later with reference to FIGS. 10A and 10B.

During the sealing process, the atmosphere may be defined by flooding the package accordingly. For example, the interior volume of the encapsulated package may be flooded with an oxygen enriched atmosphere that burns off contaminants which tend to form on interfaces where the laser beam is present. The sealing itself may also be performed so as to prevent the exchange between the package atmosphere and the environment. Due to limitations concerning the allowed sealing temperature, e.g., the components inside the package should not be influenced, in at least some implementations seam welding or laser assisted soldering/diffusion bonding may be used. In at least some implementations, localized sealing using a combination of seam welding and laser soldering may be used.

At 512, the collimation lenses may be actively aligned. For example, once the laser diode driver circuit has been bonded and the cap has been sealed, the laser diodes can be turned on and the collimations lenses for each laser diode can be actively aligned. In at least some implementations, each of the collimation lenses may be positioned to optimize spot as well as pointing for each of the respective laser diodes.

At 514, the beam combiner may be positioned to receive and combine individual laser beams into an aggregate beam. As discussed above, the beam combiner may include one or more diffractive optical elements and/or one or more refractive/reflective elements that function to combine the different color beams into an aggregate beam. The aggregate beam may be provided to other components or modules, such as a scan mirror of a laser projector, etc.

Figure 6:
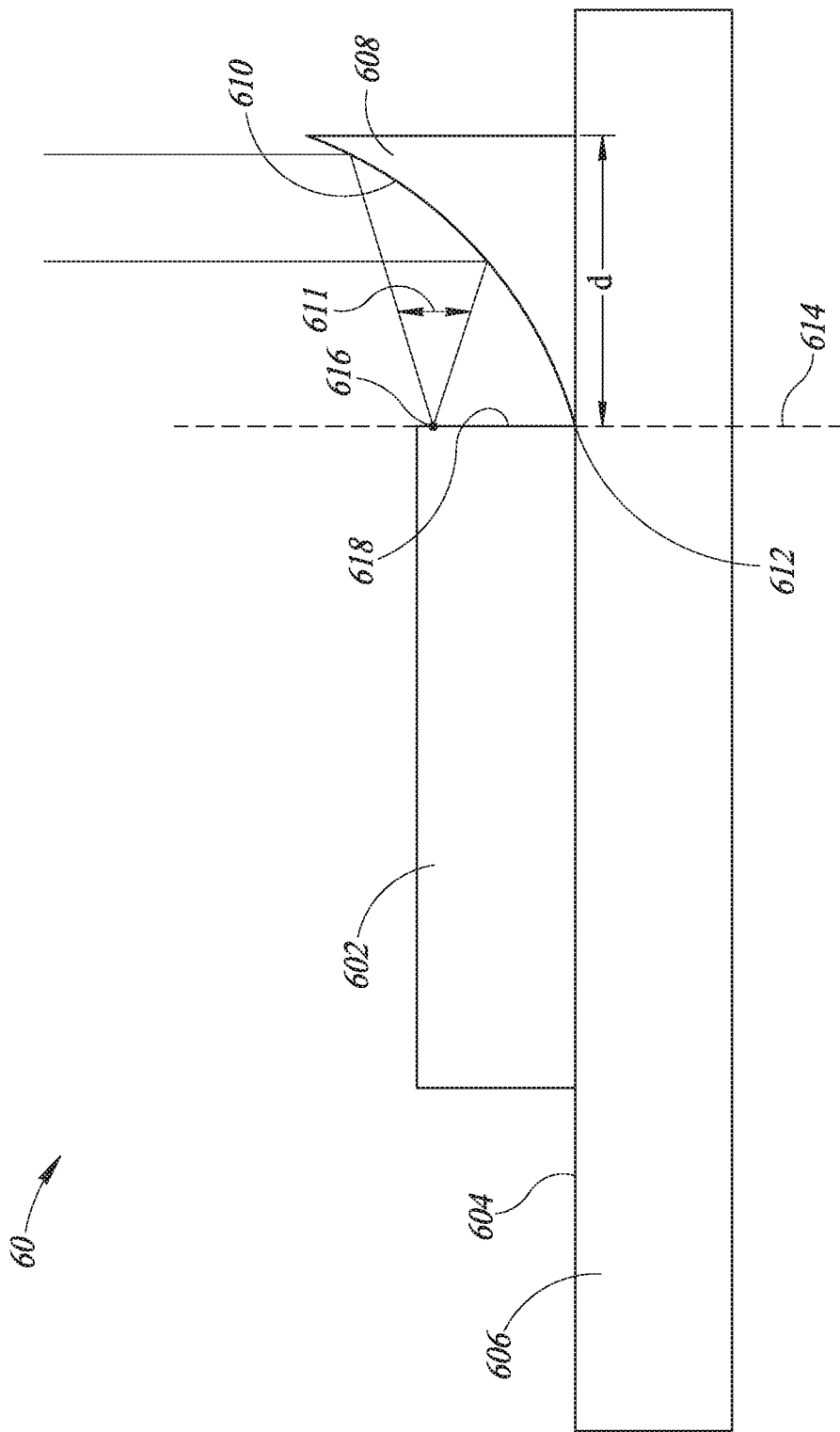
FIG. 6 is a left side, sectional elevational view of a portion of an optical engine that includes a plurality of laser diodes and an optical director element that includes a curved reflective surface, in accordance with the present systems, devices, and methods.

FIG. 6 is a left side, sectional elevational view of a portion of an optical engine 600. The optical engine 600 may include components that may be similar or identical to the components of the optical engines discussed above. Accordingly, a discussion of all of the components of the optical engine 600 is not repeated herein in the interest of brevity.

The optical engine 600 includes a plurality of laser diodes or laser dies 602 mounted directly (i.e., without a chip submount) on a top surface 604 of a base substrate 606. In at least some implementations, one or more of the laser diodes 602 may be mounted on the top surface 604 of the base substrate 606 via a chip submount. The optical engine 600 also includes an optical director element 608 that includes a curved reflective surface 610 which collimates laser light emitted by the laser diodes 602 along the respective fast axes 611 thereof. The optical director element 608 includes an edge 612 proximate the laser diodes 602 that is coplanar with a plane 614 that is orthogonal to the top surface 604 of the base substrate 606. The optical director element 608 may be similar or identical to the optical director element 118 shown in FIGS. 1A and 1B.

In the illustrated implementation, the curved reflective surface 610 may include a focal line 616 (shown as a point in the view of FIG. 6) that resides in the plane 614. The laser diodes 602 are positioned such that output facets 618 of the laser diodes are positioned adjacent to (i.e., abutted against) the edge 612 of the optical director element 608. This feature allows the edge 612 of the optical director element 608 to be used to passively position the laser diodes 602 on the top surface 604 of the base substrate 606. Generally, the optical director element 608 may have a depth d selected such that the emitter portions of the laser diodes 602 are positioned at the focal line 616 of the curved reflective surface 610 when the laser diodes 602 (or chip submounts when used) are abutted against the edge 612 of the optical director element 608.

FIG. 7 is an isometric view of a laser diode 700. The laser diode 700 may be similar or identical to the various laser diodes discussed herein. The laser diode 700 outputs a laser light beam 702 via an output facet 704 of the laser diode. FIG. 7 shows the divergence of the light 702 emitting from the laser diode 700. As shown, the light beam 702 may diverge by a substantial amount along a fast axis 706 (or perpendicular axis) and by a lesser amount in the slow axis 708 (parallel axis). As a non-limiting example, in at least some implementations, the light beam 702 may diverge with full width half maximum (FWHM) angles of up to 40 degrees in the fast axis direction 706 and up to 10 degrees in the slow axis direction 708. This divergence results in a rapidly expanding elliptical cone. As discussed above, by utilizing an optical director element that collimates the beam 702 in the fast axis direction 706, the external dimensions of the optics may be reduced and better circularization of the beam may be achieved.

Figure 8A:
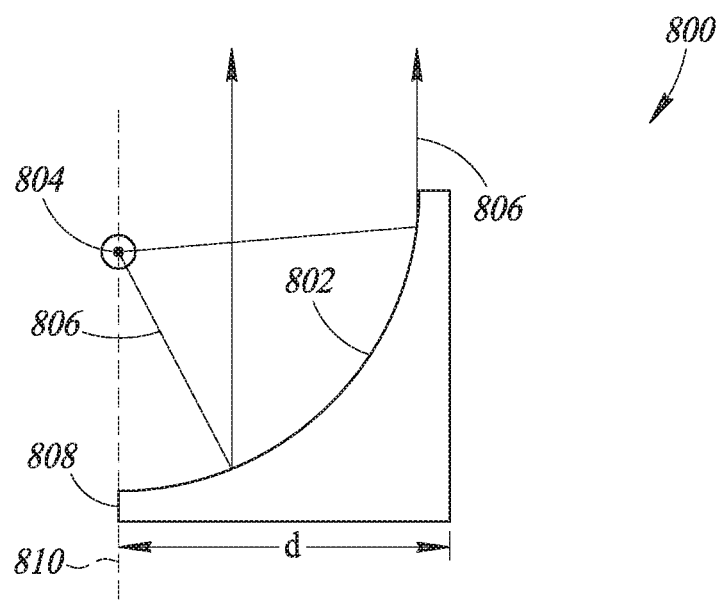
FIG. 8A is a left side elevational view of an optical director element, showing a focal line thereof, in accordance with the present systems, devices, and methods.
Figure 8B:
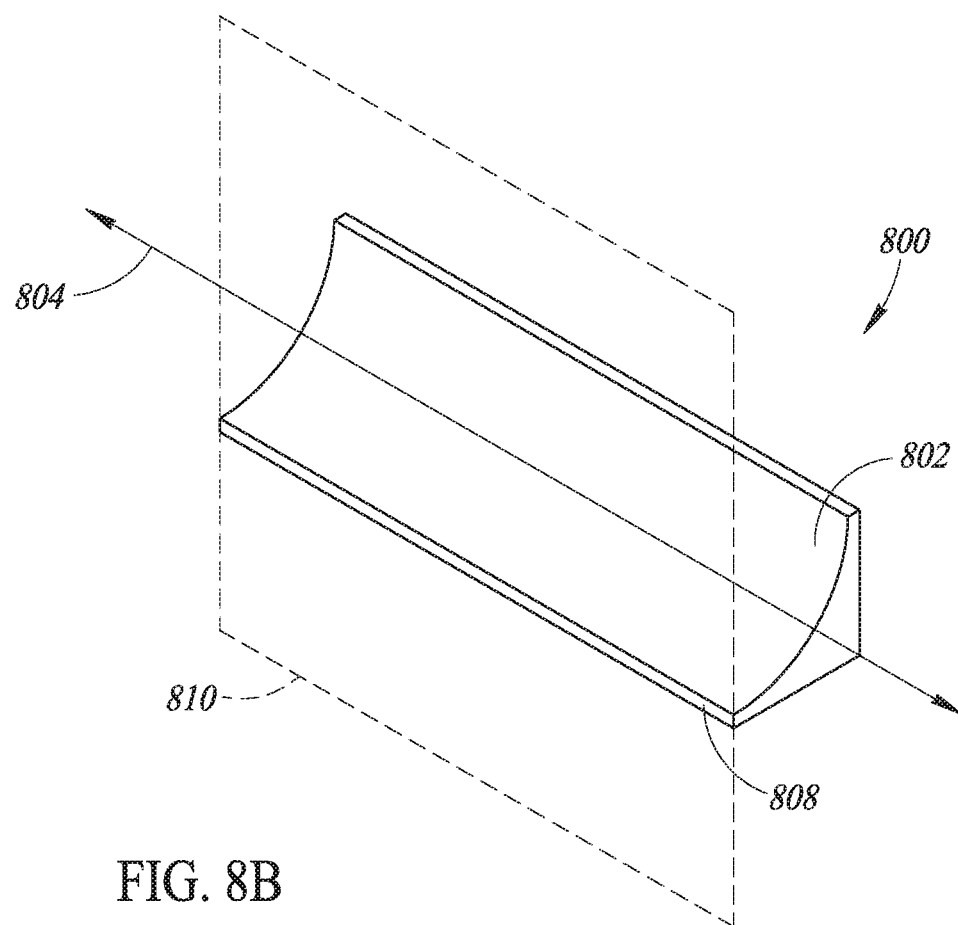
FIG. 8B is an isometric view of the optical director element of FIG. 8A, in accordance with the present systems, devices, and methods.

FIG. 8A is a left side elevational view of an optical director element 800, and FIG. 8B is an isometric view of the optical director element. The optical director element 800 may be similar or identical to the other optical director elements described herein. The optical director element 800 includes a curved reflective surface 802. In at least some implementations, the curved reflective surface has a shape of an off-axis parabolic cylinder that has a focal line 804. As discussed above, in an optical engine, the optical director element 800 may be positioned relative to a row of laser diodes such that the emitter portions (e.g., output facets) of the laser diodes are aligned with or collinear to the focal line 804 of the parabolic cylinder. Thus, beams 806 emitted from the focal line 804 are collimated in the fast axis direction by the curved reflective surface, as discussed above.

Additionally, in at least some implementations, the optical director element 800 may include an edge 808 that is aligned with the focal line 804 of the parabolic cylinder in a plane 810 that is orthogonal to a top surface of a base substrate to which the optical director element may be bonded. Thus, as discussed above, the edge 808 may be used to align a row of laser diodes relative to the optical director element 800 by abutting the laser diodes against the edge, which positions output facets of the laser diodes in alignment with the focal line 804 of the parabolic cylinder. More generally, optical director element 800 may be designed to have a depth such that emitter portions of laser diodes are aligned with the focal line 804 when the laser diodes (or chip submounts) are positioned adjacent to the edge 808 to passively align the laser diodes with the optical director element 800.

Figure 9:
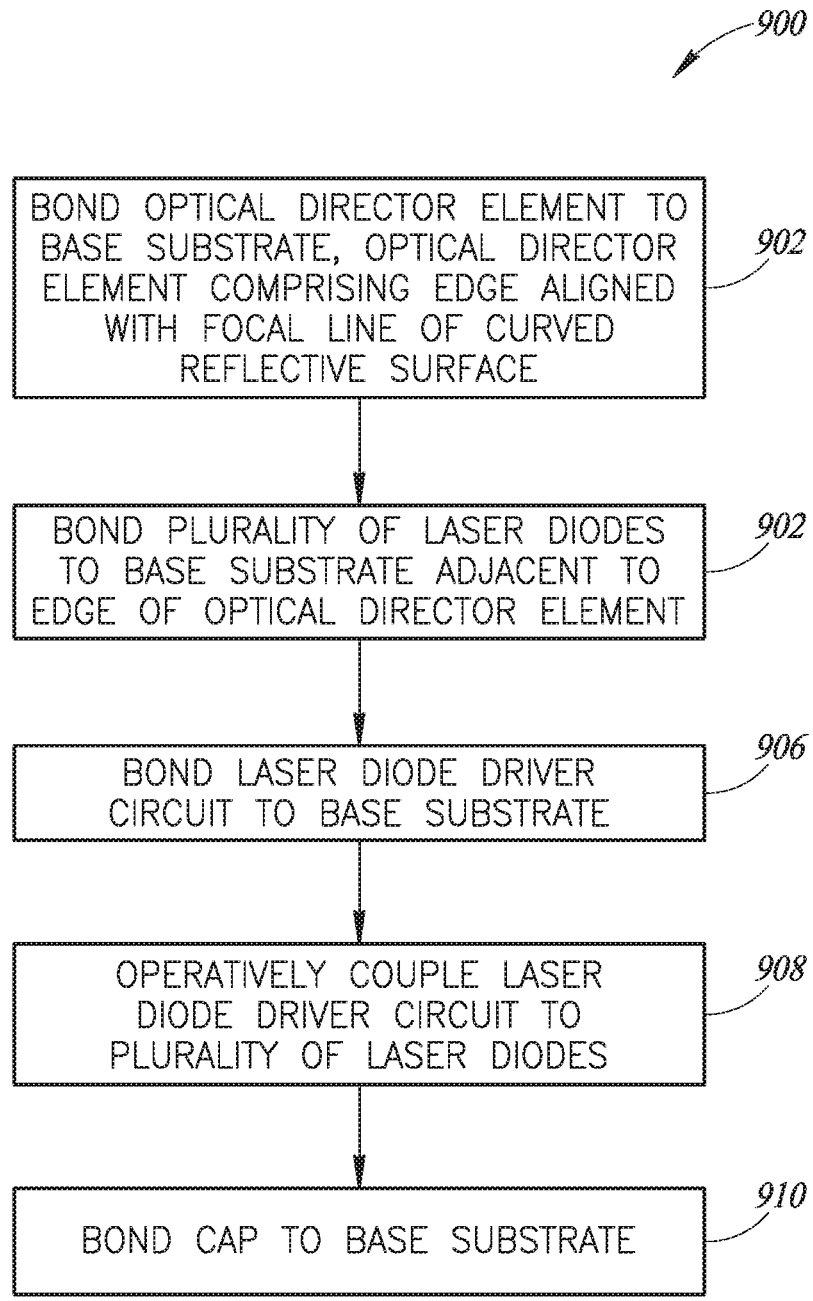
FIG. 9 is a flow diagram of a method of manufacturing an optical engine, in accordance with the present systems, devices, and methods.

FIG. 9 is a flow diagram of a method 900 of manufacturing an optical engine, in accordance with the present systems, devices, and methods. The method 900 may be implemented to manufacture the optical engines discussed herein, for example. It should be appreciated that methods of manufacturing optical engines according to the present disclosure may include fewer or additional acts than set forth in the method 900. Further, the acts discussed below may be performed in an order different than the order presented herein.

At 902, an optical director element may be bonded to a base substrate. The optical director element may include a curved reflective surface (e.g., parabolic surface) and an edge. The edge may be aligned with a focal line of the curved reflective surface. For example, the edge may be aligned with the focal line of the curved reflective surface in a plane that is orthogonal to a top surface of the base substrate. The edge may also be laterally offset from the focal line by a known distance. For example, in at least some implementations, the edge may be sized and dimensioned such that an emitter of a laser diode is aligned with the focal line when an edge of the laser diode, or an edge of a chip submount that supports a laser diode, is positioned adjacent the edge of the optical director element.

At 904, a plurality of laser diodes may be bonded to the base substrate. Optionally, some or all of the laser diodes may be mounted onto corresponding chip submounts which are bonded to the base substrate. The base substrate may be formed from a material that is RF compatible and is suitable for hermetic sealing. For example, the base substrate may be formed from low temperature co-fired ceramic (LTCC), aluminum nitride (AlN), alumina, Kovar®, etc. Since several laser diodes are bonded next to each other on the same base substrate, it may be advantageous to either "step-solder" them sequentially or to use a bonding technique that does not rely on re-melting of solder materials. Several bonding techniques in this regard are discussed above with reference to FIG. 5. The plurality of laser diodes may be bonded at respective positions wherein, for each of the plurality of laser diodes, an output facet thereof is positioned adjacent to the edge of the optical director element to align the output facet with the focal line of the curved reflective surface. As discussed above, in at least some implementations, if the emitters of the laser diodes are not in the same plane as an edge of the laser diodes (or chip submounts), the edge of the optical director element may be sized and dimensioned to align the emitters with the focal line of the reflective curved surface when positioned adjacent the optical director element.

At 906, a laser diode driver circuit may optionally be bonded to the base substrate. As noted above, the laser diode driver circuit may be bonded to the base substrate such that the distance between the laser diode driver circuit and the laser diodes is minimized. As noted above, the laser diode driver circuit may be bonded to any suitable portion of the base substrate, such as the top surface or the bottom surface of the base substrate. The process used to bond the laser diode driver circuit to the base substrate may be any suitable bonding process, such as bonding processes commonly used to bond surface mount devices (SMD) to circuit boards. In alternative implementations, the laser diode driver circuit may be bonded to a separate base substrate from the other components mentioned above. In other alternative implementations, the laser diode driver circuit may be mounted directly to a frame of a WHUD.

At 908, the laser diode driver circuit may be operatively coupled to the plurality of laser diodes. For example, the laser diode driver circuit may be operatively coupled to the plurality of laser diodes via suitable electrical connections to selectively drive current to the plurality of laser diodes. For implementations where the laser diode drive circuit is not bonded to the same base substrate as the other components mentioned above, a plurality of electrical contacts and electrical connections could be bonded to the base substrate, each electrical connection operatively connecting a respective electrical contact to a respective laser diode. Subsequently, the at least one laser driver circuit could be operatively coupled to the electrical contacts, which will then electrically couple the laser diode drive circuit to the electrical connections and consequently to the laser diodes. An exemplary arrangement of electrical connections and electrical contacts is discussed later with reference to FIG. 10B.

The laser diode driver circuit may be operatively coupleable to a controller (e.g., microcontroller, microprocessor, ASIC) which controls the operation of the laser diode driver circuit to selectively modulate laser light emitted by the laser diodes.

At 910, a cap may be bonded to the base substrate to form a hermetic or partially hermetic seal between the interior volume of the encapsulated package and an exterior environment. As noted above, it may be desirable to maintain a specific atmosphere for the laser diode chips for reliability reasons. In at least some implementations, adhesive sealing may be undesirable because of the high permeability of gases. This is especially the case for blue laser diodes, which emit blue laser light that may bake contamination on facets and windows, thereby reducing transparency of the optical window. However, as detailed above regarding FIGS. 1A and 1B, partial hermeticity, a particulate dust cover, or even no protective cover may be acceptable for certain applications. In implementations where the cap would be bonded over electrical connections which connect the at least one laser diode driver circuit to the plurality of laser diodes, such as if the at least one laser diode driver circuit is bonded to the same side of a base substrate as the laser diodes, or if the at least one laser diode driver circuit is coupled to electrical contacts bonded to the same side of the base substrate as the laser diodes, an electrically insulating cover can first be bonded to the base substrate over the electrical connections. Subsequently, the cap can be bonded at least partially to the electrically insulating cover, and potentially to a portion of the base substrate if the insulating cover does not fully encircle the intended interior volume. In this way, at least a portion of the cap will be bonded to the base substrate indirectly by being bonded to the electrically insulating cover. In some implementations, the entire cap could be bonded to the base substrate indirectly by being bonded to an electrically insulating cover which encircles the intended interior volume. Exemplary electrically insulating covers are discussed later with reference to FIGS. 10A and 10B.

During the sealing process, the atmosphere may be defined by flooding the package accordingly. For example, the interior volume of the encapsulated package may be flooded with an oxygen enriched atmosphere that burns off contaminants which tend to form on interfaces where the laser beam is present. The sealing itself may also be performed so as to prevent the exchange between the package atmosphere and the environment. Due to limitations concerning the allowed sealing temperature, e.g., the components inside the package should not be influenced, in at least some implementations seam welding or laser assisted soldering/diffusion bonding may be used.

In at least some implementations, a collimation lenses may be actively aligned. For example, once the laser diode driver circuit has been bonded and the cap has been sealed, the laser diodes can be turned on and the collimations lenses for each laser diode can be actively aligned. In at least some implementations, each of the collimation lenses may be positioned to optimize spot as well as pointing for each of the respective laser diodes.

In at least some implementations, a beam combiner may be positioned to receive and combine individual laser beams into an aggregate beam. As discussed above, the beam combiner may include one or more diffractive optical elements and/or one or more refractive/reflective elements that function to combine the different color beams into an aggregate beam. The aggregate beam may be provided to other components or modules, such as a scan mirror of a laser projector, etc.

Figure 10A:
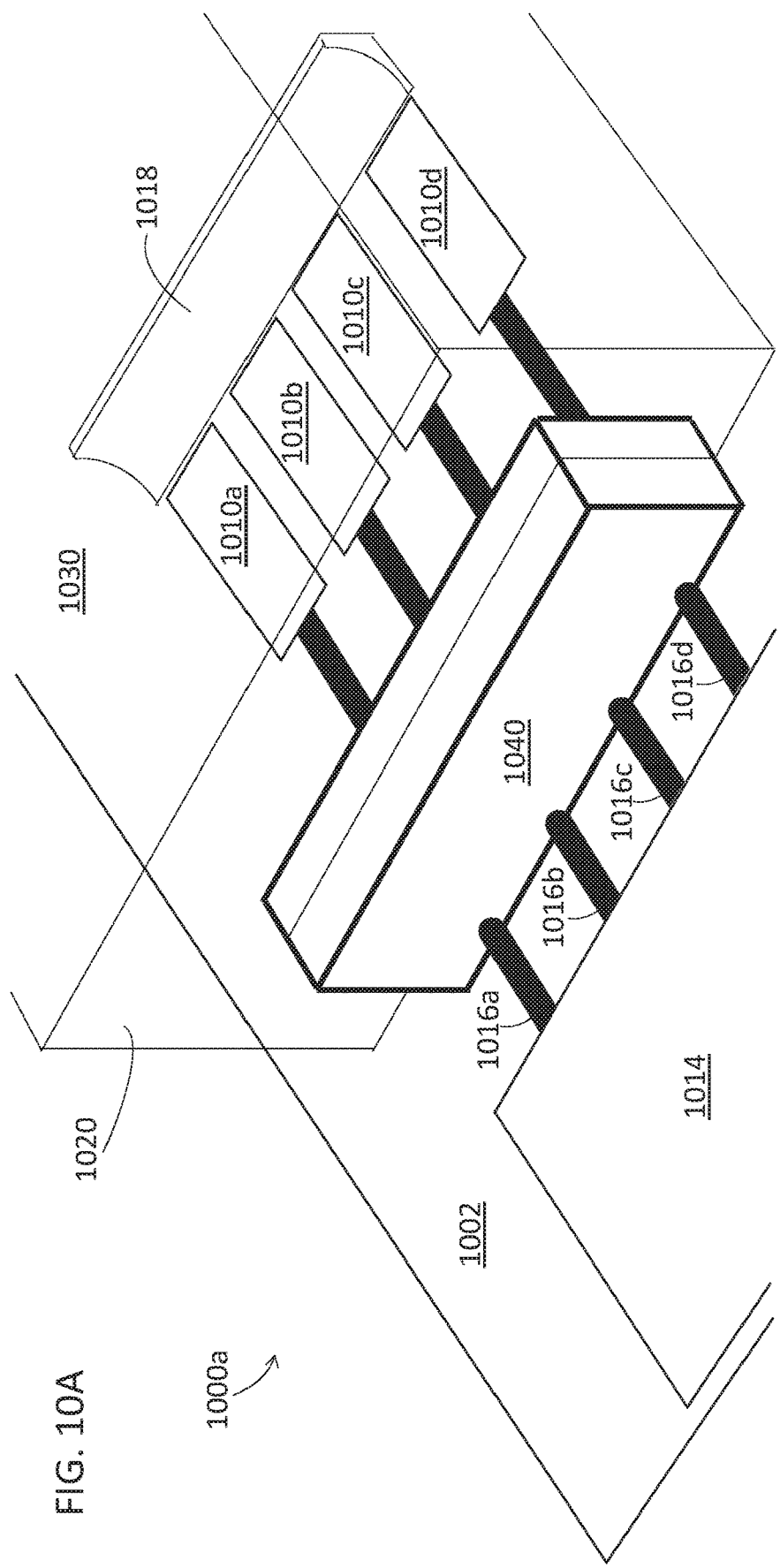
FIGS. 10A and 10B are isometric views showing implementations of optical engines having differing positions for a laser diode driver circuit in accordance with the present systems, devices, and methods.
Figure 10B:
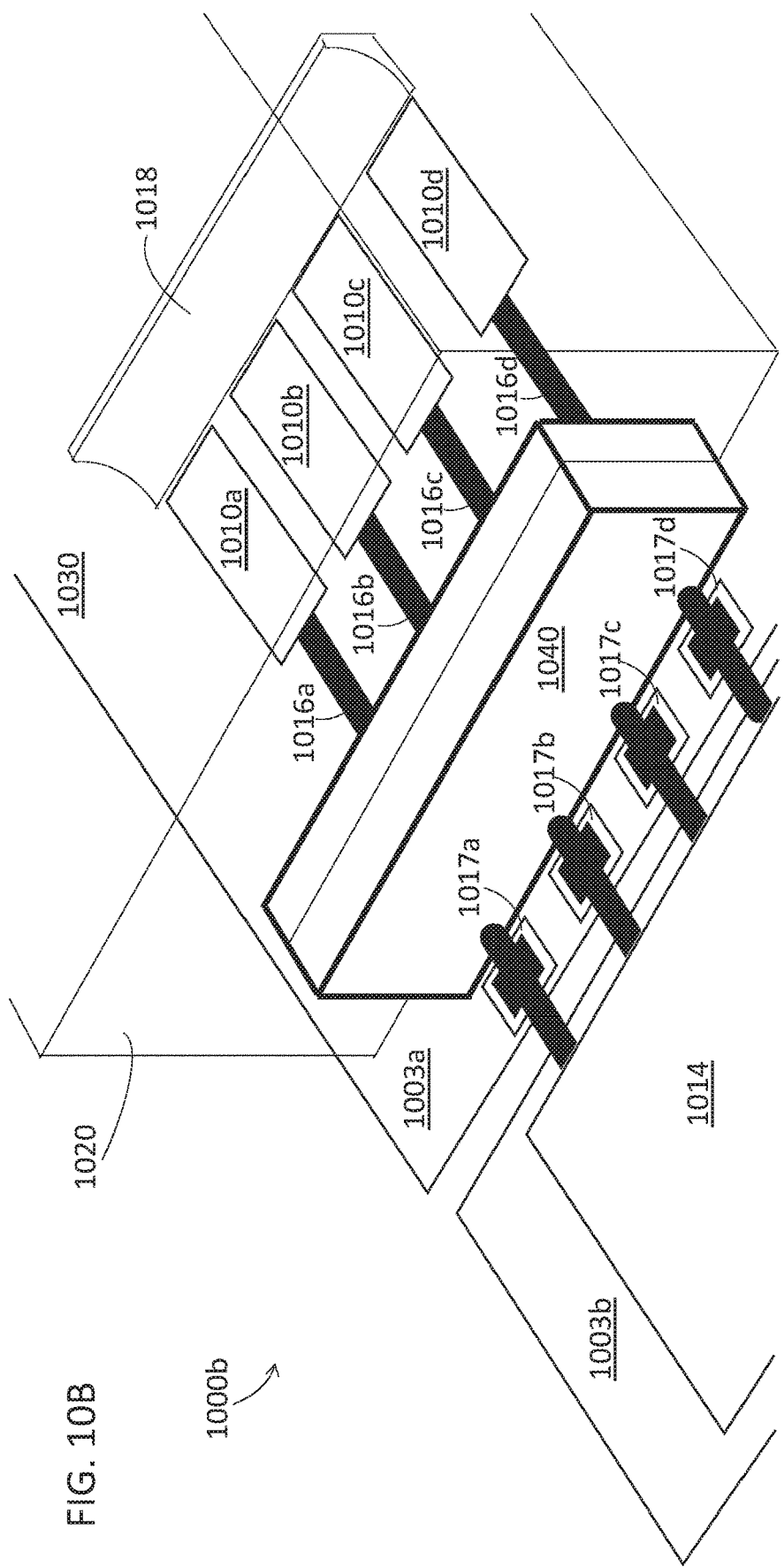

FIGS. 10A and 10B are isometric views showing implementations of optical engines having differing positions for a laser diode driver circuit. The implementations shown in FIGS. 10A and 10B are similar in at least some respects to the implementation of FIGS. 1A and 1B, and one skilled in the art will appreciate that the description regarding FIGS. 1A and 1B is applicable to the implementations of FIGS. 10A and 10B unless context clearly dictates otherwise.

FIG. 10A shows an optical engine 1000a which includes a base substrate 1002. The base substrate 1002 may be formed from a material that is radio frequency (RF) compatible and is suitable for hermetic sealing. For example, the base substrate 1002 may be formed from low temperature co-fired ceramic (LTCC), aluminum nitride (AlN), alumina, Kovar®, etc.

The optical engine 1000a also includes a plurality of laser diodes aligned in a row across a width of the optical engine 1000*a*, including an infrared laser diode 1010*a*, a red laser diode 1010*b*, a green laser diode 1010*c*, and a blue laser diode 1010*d*. In operation, the infrared laser diode 1010*a* provides infrared laser light, the red laser diode 1010*b* provides red laser light, the green laser diode 1010*c* provides green laser light, and the blue laser diode 1010*d* provides blue laser light. Each of the laser diodes may comprise one of an edge emitter laser or a vertical-cavity surface-emitting laser (VCSEL), for example. In FIG. 10A, laser diodes 1010*a*, 1010*b*, 1010*c*, and 1010*d* are shown as being bonded (e.g., attached) directly to base substrate 1002, similar to as in FIG. 6, but one skilled in the art will appreciate that laser diodes 1010*a*, 1010*b*, 1010*c*, and 1010*d* could each be mounted on a respective submount, similar to as in FIGS. 1A and 1B.

The optical engine 1000*a* also includes a laser diode driver circuit 1014 which can be bonded to the same surface of base substrate 1002 as the laser diodes 1010*a*, 1010*b*, 1010*c*, 1010*d*. In alternative implementations, laser diode driver circuit 1014 can be bonded to a separate base substrate, such as in FIG. 10B discussed later. The laser diode driver circuit 1014 is operatively coupled to the plurality of laser diodes 1010*a*, 1010*b*, 1010*c*, and 1010*d* via respective electrical connections 1016*a*, 1016*b*, 1016*c*, 1016*d* to selectively drive current to the plurality of laser diodes. In at least some implementations, the laser diode driver circuit 1014 may be positioned relative to the laser diodes 1010*a*, 1010*b*, 1010*c*, and 1010*d* to minimize the distance between the laser diode driver circuit 1014 and the laser diodes. Although not shown in FIG. 10A, the laser diode driver circuit 1014 may be operatively coupleable to a controller (e.g., microcontroller, microprocessor, ASIC) which controls the operation of the laser diode driver circuit 1014 to selectively modulate laser light emitted by the laser diodes 1010*a*, 1010*b*, 1010*c*, and 1010*d*. In at least some implementations, the laser diode driver circuit 1014 may be bonded to another portion of the base substrate 1002, such as the bottom surface of the base substrate 1002. In at least some implementations, the laser diode driver circuitry 1014 may be remotely located and operatively coupled to the laser diodes 1010*a*, 1010*b*, 1010*c*, and 1010*d*. In order to not require the use of impedance matched transmission lines, the size scale may be small compared to a wavelength (e.g., lumped element regime), where the electrical characteristics are described by (lumped) elements like resistance, inductance, and capacitance.

Proximate the laser diodes 1010*a*, 1010*b*, 1010*c*, and 1010*d* there is positioned an optical director element 1018. Like the laser diodes 1010*a*, 1010*b*, 1010*c*, and 1010*d*, the optical director element 1018 is bonded to the top surface of the base substrate 1002. The optical director element 1018 may be bonded proximate to or adjacent each of the laser diodes 1010*a*, 1010*b*, 1010*c*, and 1010*d*. In the illustrated example, the optical director element 1018 has a curved reflective surface and includes a plurality of planar faces, similar to optical director element 118 in FIGS. 1A and 1B. The optical director element 1018 may comprise a mirror or a prism, for example.

The optical engine 1000*a* also includes a cap 1020 similar to cap 120 in FIGS. 1A and 1B. For clarity, cap 1020 is shown as being transparent in FIG. 10A, though this is not necessarily the case, and cap 1020 can be formed of an opaque material. Cap 1020 includes a horizontal optical window 1030 that forms the "top" of the cap 1020. Although optical window 1030 in FIG. 10A is shown as comprising the entire top of cap 1020, in alternative implementations optical window could comprise only a portion of the top of cap 1020. Cap 1020 including optical window 1030 defines an interior volume sized and dimensioned to receive the plurality of laser diodes 1010*a*, 1010*b*, 1010*c*, 1010*d*, and the optical director element 1018. Cap 1020 is bonded to the base substrate 1002 to provide a hermetic or partially hermetic seal between the interior volume of the cap 1020 and a volume exterior to the cap 1020.

The optical director element 1018 is positioned and oriented to direct (e.g., reflect) laser light received from each of the plurality of laser diodes 1010*a*, 1010*b*, 1010*c*, and 1010*d* upward toward the optical window 1030 of the cap 1020, wherein the laser light exits the interior volume, similar to FIGS. 1A and 1B. The curved reflective surface of the optical director element 1018 collimates the laser light along fast axes of the laser light received from the plurality of laser diodes 1010*a*, 1010*b*, 1010*c*, and 1010*d*, such that laser light reflected upward toward the optical window 1030 by the curved reflective surface is collimated along the fast axis of each of the respective light beams, similar to as described for FIGS. 1A and 1B. FIG. 7, discussed above, illustrates an example laser diode, such as one of the laser diodes 1010*a*, 1010*b*, 1010*c*, or 1010*d*, showing a fast axis and a slow axis of a light beam generated by the laser diode. Although the optical director element 1018 is shown as a single element that collimates the light from each of the laser diodes, in at least some implementations individual collimators (fast and slow axis) may be provided for each of the laser diodes. For example, the optical director element 1018 may be replaced with a row of four fast axis collimators, or four fast axis collimators may be positioned to collimate light beams from the four laser diodes 1010*a*, 1010*b*, 1010*c*, and 1010*d* before or after the light beams are directed by the optical director element 1018.

The cap 1020 may have a round shape, rectangular shape, or other shape, similarly to as described regarding FIGS. 1A and 1B above. The optical window 1030 may comprise an entire top of the cap 1020, or may comprise only a portion thereof. In at least some implementations, the optical window 1030 may be located on a sidewall of cap 1020 rather than positioned as a top of the cap 1020, and the laser diodes 1010*a*, 1010*b*, 1010*c*, 1010*d* and/or the optical director element 1018 may be positioned and oriented to direct the laser light from the laser diodes toward the optical window on the sidewall. In at least some implementations, the cap 1020 may include a plurality of optical windows instead of a single optical window.

The optical engine 1000*a* can also include four collimation/pointing lenses similarly to as discussed regarding FIGS. 1A and 1B above. Each of the collimation lenses can be operative to receive laser light from a respective one of the laser diodes 1010*a*, 1010*b*, 1010*c*, or 1010*d*, and to generate a single color beam.

The optical engine 1000*a* may also include, or may be positioned proximate to, a beam combiner that is positioned and oriented to combine the light beams received from each of the collimation lenses or laser diodes 1010*a*, 1010*b*, 1010*c*, or 1010*d* into a single aggregate beam. As an example, the beam combiner may include one or more diffractive optical elements (DOE) and/or one or more refractive/reflective optical elements that combine the different color beams in order to achieve coaxial superposition. An example beam combiner is shown in FIG. 3 and discussed above.

In at least some implementations, the laser diodes 1010*a*, 1010*b*, 1010*c*, 1010*d*, the optical director element 1018, and/or the collimation lenses may be positioned differently. As noted above, laser diode driver circuit 1014 may be mounted on a top surface or a bottom surface of the base substrate 1002, depending on the RF design and other constraints (e.g., package size). In at least some implementations, the optical engine 1000a may not include the optical director element 1018, and the laser light may be directed from the laser diodes 1010a, 1010b, 1010c, and 1010d toward collimation lenses without requiring an intermediate optical director element. Additionally, in at least some implementations, one or more of the laser diodes may be mounted directly on the base substrate 1002 with a submount.

Optical engine 1000a in FIG. 10A also includes an electrically insulating cover 1040. In FIG. 10A, laser diodes 1010a, 1010b, 1010c, and 1010d are each connected to laser diode driver circuitry 1014 by a respective electrical connection 1016a, 1016b, 1016c, or 1016d. Electrical connections 1016a, 1016b, 1016c, and 1016d run across a surface of the base substrate 1002. Electrically insulating cover 1040 is placed, adhered, formed, or otherwise positioned over electrical connections 1016a, 1016b, 1016c, and 1016d, such that each of the electrical connections 1016a, 1016b, 1016c, and 1016d run through electrically insulating cover 1040. Cap 1020 is placed, adhered, formed, or otherwise positioned over electrically insulating cover 1040, such that cap 1020 does not contact any of the electrical connections 1016a, 1016b, 1016c, or 1016d. For clarity, cap 1020 is shown as being transparent in FIG. 10A, though this is not necessarily the case, and cap 1020 can be formed of an opaque material. Electrically insulating cover 1040 can be formed of a material with low electrical permittivity such as a ceramic, such that electrical signals which run through electrical connections 1016a, 1016b, 1016c, and 1016d do not run into or through electrically insulating cover 1040. In this way, electrical signals which run through electrical connections 1016a, 1016b, 1016c, and 1016d can be prevented from running into or through cap 1020, which can be formed of an electrically conductive material. Although FIG. 10A shows electrically insulating cover 1040 as extending along only part of a side of cap 1020, one skilled in the art will appreciate that electrically insulating cover 1040 can extend along an entire side length of cap 1020.

One skilled in the art will appreciate that the positions of laser diode driver circuitry 1014, electrical connections 1016a, 1016b, 1016c, 1016d, and electrically insulating cover 1040 as shown in FIG. 10A could also be applied in other implementations of the subject systems, devices and methods. For example, in the implementations of FIGS. 1A and 1B, laser diode driver circuitry 114 could be positioned on top surface 104 of base substrate 102, and electrical connections 116 could run across top surface 104 under an electrically insulating cover, such that electrical connections 116 do not contact any conductive portion of cap 120.

FIG. 10B is an isometric view an optical engine 1000b, similar in at least some respects to optical engine 1000a of FIG. 10A. One skilled in the art will appreciate that the description of optical engine 1000a in FIG. 10A is applicable to optical engine 1000b, in FIG. 10B, unless context clearly dictates otherwise. The optical engine 1000b, includes a base substrate 1003a. Similar to base substrate 1002 in FIG. 10A, base substrate 1003a may be formed from a material that is radio frequency (RF) compatible and is suitable for hermetic sealing. For example, the base substrate 1003a may be formed from low temperature co-fired ceramic (LTCC), alumina, Kovar®, etc.

One difference between optical engine 1000b, in FIG. 10B and optical engine 1000a in FIG. 10A relates to what components are bonded (e.g. attached) to base substrate 1003a. In optical engine 1000b, each of: laser diodes 1010a, 1010b, 1010c, 1010d; cap 1020; electrical connections 1016a, 1016b, 1016c, 1016d; and electrically insulating cover 1040 are bonded (e.g., attached) to base substrate 1003a. However, laser diode driver circuit 1014 is not necessarily bonded directly to base substrate 1003a. Instead, laser diode driver circuit 1014 could be bonded to a separate base substrate 1003b. Similar to base substrate 1002 in FIG. 10A and base substrate 1003a in FIG. 10B, base substrate 1003b may be formed from a material that is radio frequency (RF) compatible and is suitable for hermetic sealing. For example, the base substrate 1003b may be formed from low temperature co-fired ceramic (LTCC), alumina, Kovar®, etc. In an alternative implementation, laser diode drive circuit 1014 may not need to be bonded to a substrate at all, and could simply be mounted directly within a frame of a WHUD.

For implementations where laser diode drive circuit 1014 is not bonded to base substrate 1003a, electrical contacts 1017a, 1017b, 1017c, and 1017d could be bonded to base substrate 1003a, each at an end of a respective electrical connection 1016a, 1016b, 1016c, or 1016d. In this way, electrical contacts 1017a, 1017b, 1017c, and 1017d could be used to electrically couple laser diode drive circuit 1014 to electrical connections 1016a, 1016b, 1016c, and 1016d and consequently laser diodes 1010a, 1010b, 1010c, and 1010d.

A person of skill in the art will appreciate that the teachings of the present systems, methods, and devices may be modified and/or applied in additional applications beyond the specific WHUD implementations described herein. In some implementations, one or more optical fiber(s) may be used to guide light signals along some of the paths illustrated herein.

The WHUDs described herein may include one or more sensor(s) (e.g., microphone, camera, thermometer, compass, altimeter, and/or others) for collecting data from the user's environment. For example, one or more camera(s) may be used to provide feedback to the processor of the WHUD and influence where on the display(s) any given image should be displayed.

The WHUDs described herein may include one or more on-board power sources (e.g., one or more battery(ies)), a wireless transceiver for sending/receiving wireless communications, and/or a tethered connector port for coupling to a computer and/or charging the one or more on-board power source(s).

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet which are owned by Thalmic Labs Inc., including at least U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,2826, (U.S. Publication Number 2018/0210213), U.S. Non-Provisional patent application Ser. No. 5/852,205 (U.S. Publication Number 2018/0210216), U.S. Provisional Patent Application Ser. No. 62/575,677, U.S. Provisional Patent Application Ser. No. 62/591,550, U.S. Provisional Patent Application Ser. No. 62/597,294, U.S. Provisional Patent Application Ser. No. 62/608,749, U.S. Provisional Patent Application Ser. No. 62/609,870, U.S. Provisional Patent Application Serial Number 62/591,030, U.S. Provisional Patent Application Ser. No. 62/620,600, and/or U.S. Provisional Patent Application Ser. No. 62/576,962 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing an optical engine, the method comprising:
    bonding an optical director element to a base substrate, the optical director element comprising a curved reflective surface and an edge, the edge aligned with a focal line of the curved reflective surface in a plane that is orthogonal to a top surface of the base substrate;
    bonding a plurality of laser diodes to the base substrate at respective positions wherein, for each of the plurality of laser diodes, an output facet thereof is positioned adjacent to the edge of the optical director element to align the output facet with the focal line of the curved reflective surface;
    operatively coupling at least one laser diode driver circuit to the plurality of laser diodes; and
    bonding a cap to the base substrate, the cap comprising at least one wall and at least one optical window that together define an interior volume sized and dimensioned to receive at least the plurality of laser diodes and the optical director element, the cap providing a hermetic or partially hermetic seal between the interior volume of the cap and a volume exterior to the cap, and the optical window positioned and oriented to allow light emitted from the plurality of laser diodes to exit the interior volume via the optical director element.

2. The method of claim 1 wherein bonding an optical director element to a base substrate comprises bonding an optical director element to the base substrate, and the shape of the curved reflective surface of the optical director element is defined by a parabolic cylinder.

3. The method of claim 1 wherein bonding a plurality of laser diodes to the base substrate at respective positions comprises bonding each of the plurality of laser diodes to a corresponding one of a plurality of chip submounts, and bonding the plurality of chip submounts to the base substrate.

4. The method of claim 1, further comprising bonding the at least one laser diode driver circuit to the base substrate.

5. The method of claim 4 wherein operatively coupling at least one laser diode driver circuit to the plurality of laser diodes comprises bonding a plurality of electrical connections to the base substrate, each electrical connection operatively coupling a respective laser diode to the at least one laser diode driver circuit.

6. The method of claim 5, further comprising bonding an electrically insulating cover to the base substrate over at least a portion of the plurality of electrical connections, wherein bonding a cap to the base substrate comprises bonding at least a portion of the cap to the base substrate indirectly by bonding the at least a portion of the cap to the electrically insulating cover.

7. The method of claim 1, further comprising:
bonding a plurality of electrical contacts to the base substrate; and
bonding a plurality of electrical connections to the base substrate, each electrical connection being operatively coupled to a respective laser diode of the plurality of laser diodes and to a respective electrical contact of the plurality of electrical contacts, wherein operatively coupling at least one laser diode driver circuit to the plurality of laser diodes comprises operatively coupling the at least one laser diode driver circuit to the plurality of electrical contacts.

8. The method of claim 7, further comprising bonding an electrically insulating cover to the base substrate over at least a portion of the plurality of electrical connections, wherein bonding a cap to the base substrate comprises bonding at least a portion of the cap to the base substrate indirectly by bonding the at least a portion of the cap to the electrically insulating cover.

9. The method of claim 1, further comprising:
positioning a plurality of collimation lenses to the optical window, each of the plurality of collimation lenses positioned and oriented to receive light from a corresponding one of the plurality of laser diodes through the optical window.

10. The method of claim 9, further comprising:
positioning and orienting a beam combiner to combine light beams received from each of the collimation lenses into a single aggregate beam.

* * * * *